US011626336B2

(12) United States Patent
Garcia et al.

(10) Patent No.: US 11,626,336 B2
(45) Date of Patent: Apr. 11, 2023

(54) PACKAGE COMPRISING A SOLDER RESIST LAYER CONFIGURED AS A SEATING PLANE FOR A DEVICE

(71) Applicant: QUALCOMM Incorporated, San Diego, CA (US)

(72) Inventors: Daniel Garcia, San Diego, CA (US); Kinfegebriel Amera Mengistie, San Diego, CA (US); Francesco Carrara, San Diego, CA (US); Chang-Ho Lee, San Diego, CA (US); Ashish Alawani, San Diego, CA (US); Mark Kuhlman, Laguna Niguel, CA (US); John Jong-Hoon Lee, San Diego, CA (US); Jeongkeun Kim, San Diego, CA (US); Xiaoju Yu, San Diego, CA (US); Supatta Niramarnkarn, Santee, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/590,299

(22) Filed: Oct. 1, 2019

(65) Prior Publication Data
US 2021/0098320 A1 Apr. 1, 2021

(51) Int. Cl.
H01L 23/16 (2006.01)
H01L 21/48 (2006.01)
(Continued)

(52) U.S. Cl.
CPC .......... H01L 23/16 (2013.01); H01L 21/4853 (2013.01); H01L 21/565 (2013.01);
(Continued)

(58) Field of Classification Search
CPC . H01L 2224/02135; H01L 2224/10145; H01L 23/16
See application file for complete search history.

(56) References Cited

U.S. PATENT DOCUMENTS 4,642,329 A * 2/1987 Kirchhoff .............. C08G 61/02 526/284
4,661,193 A * 4/1987 Kirchhoff .............. C08G 61/00 548/549

(Continued)

FOREIGN PATENT DOCUMENTS

CA 2273754 A1 * 12/1999 ........... H05K 3/3442
JP H06326445 A * 11/1994 ............. H01L 23/50

OTHER PUBLICATIONS electronics-lab.com, "Top 10 Websites to Find Footprints for Your Next PCB Project", https://web.archive.org/web/20190729184832/https://www.electronics-lab.com/top-10-websites-to-find-footprints-for-your-next-pcb-project/, Jul. 29, 2019. (Year: 2019).*

(Continued)

Primary Examiner — Vincent Wall
(74) Attorney, Agent, or Firm — Qualcomm Incorporated

(57) ABSTRACT

A package that includes a substrate having a first surface; a solder resist layer coupled to the first surface of the substrate; a device located over the solder resist layer such that a portion of the device touches the solder resist layer; and an encapsulation layer located over the solder resist layer such that the encapsulation layer encapsulates the device. The solder resist layer is configured as a seating plane for the device. The device is located over the solder resist layer such that a surface of the device facing the substrate is approximately parallel to the first surface of the substrate. The solder resist layer includes at least one notch. The device is located (Continued)

over the solder resist layer such that at least one corner of the device touches the at least one notch.

28 Claims, 16 Drawing Sheets

(51) Int. Cl.
    *H01L 21/56*      (2006.01)
    *H01L 23/31*      (2006.01)
    *H01L 23/498*      (2006.01)
    *H01L 23/552*      (2006.01)
    *H01L 23/00*      (2006.01)

(52) U.S. Cl.
    CPC .... *H01L 23/3114* (2013.01); *H01L 23/49838* (2013.01); *H01L 23/552* (2013.01); *H01L 24/16* (2013.01); *H01L 2224/16227* (2013.01); *H01L 2924/3025* (2013.01)

(56) References Cited

U.S. PATENT DOCUMENTS

| | | | | |
|---|---|---|---|---|
| 5,162,613 | A * | 11/1992 | Schoenthaler | H01R 13/2414 |
| | | | | 257/E21.511 |
| 5,344,899 | A * | 9/1994 | Enomoto | C08G 61/02 |
| | | | | 257/E23.119 |
| 5,647,123 | A * | 7/1997 | Greenwood | H05K 3/3452 |
| | | | | 257/E21.511 |
| 5,726,501 | A * | 3/1998 | Matsubara | H01L 24/16 |
| | | | | 257/772 |
| 5,920,126 | A * | 7/1999 | Sohara | H01L 24/29 |
| | | | | 257/667 |
| 6,049,122 | A * | 4/2000 | Yoneda | H01L 21/563 |
| | | | | 257/737 |
| 6,087,062 | A * | 7/2000 | Cunningham | G03F 7/029 |
| | | | | 526/196 |
| 6,115,262 | A * | 9/2000 | Brunner | H05K 3/3442 |
| | | | | 361/772 |
| 6,133,064 | A * | 10/2000 | Nagarajan | H01L 23/42 |
| | | | | 257/E21.503 |
| 7,513,035 | B2 * | 4/2009 | Too | H01L 23/3675 |
| | | | | 29/840 |
| 7,564,140 | B2 * | 7/2009 | Lee | H01L 21/563 |
| | | | | 257/778 |
| 8,536,458 | B1 * | 9/2013 | Darveaux | H01L 24/13 |
| | | | | 174/255 |
| 2003/0210531 | A1 * | 11/2003 | Alcoe | H01L 23/16 |
| | | | | 361/728 |
| 2004/0214375 | A1 * | 10/2004 | Naitoh | H01L 24/81 |
| | | | | 438/117 |
| 2005/0146397 | A1 * | 7/2005 | Koga | H03H 9/0576 |
| | | | | 333/133 |
| 2007/0145553 | A1 * | 6/2007 | Araki | H01L 24/11 |
| | | | | 257/E23.021 |
| 2007/0281557 | A1 * | 12/2007 | Shih | H01L 21/4853 |
| | | | | 439/876 |
| 2009/0283317 | A1 * | 11/2009 | Ozawa | H01L 23/49838 |
| | | | | 174/267 |
| 2012/0126395 | A1 | 5/2012 | Lee et al. | |
| 2013/0001274 | A1 * | 1/2013 | Konno | H01L 21/4853 |
| | | | | 228/104 |
| 2013/0001760 | A1 * | 1/2013 | Ho | H01L 23/49513 |
| | | | | 257/676 |
| 2013/0270717 | A1 * | 10/2013 | Ko | H01L 25/065 |
| | | | | 257/777 |
| 2015/0008571 | A1 * | 1/2015 | Gallegos | H01L 23/562 |
| | | | | 257/690 |
| 2015/0357277 | A1 * | 12/2015 | Nagai | H05K 3/4007 |
| | | | | 174/255 |
| 2016/0172299 | A1 * | 6/2016 | Noveski | H01L 23/5226 |
| | | | | 257/737 |
| 2016/0242286 | A1 * | 8/2016 | Asai | H05K 1/0306 |
| 2016/0379747 | A1 * | 12/2016 | Wolter | H01F 17/0033 |
| | | | | 336/200 |
| 2020/0013706 | A1 | 1/2020 | Kang et al. | |
| 2020/0113056 | A1 * | 4/2020 | Hasegawa | H05K 1/0269 |

OTHER PUBLICATIONS

Mr. Robot, "Maker's Business Card is Actually a PCB, with Common SMD Components Reference Chart", https://blog.adafruit.com/2016/05/11/makers-business-card-is-actually-a-pcb-with-common-smd-components-reference-chart/, May 11, 2016 (Year: 2016).*

Tom H., "IPC-7093A BTC: QFN Solder Mask Defined Thermal Pad", https://www.pcblibraries.com/forum/ipc7093a-btc-qfn-solder-mask-defined-thermal-pad_topic2154.html, May 30, 2017 (Year: 2017).* https://www.ubuy.vn/en/product/ZRAAUYBE-integrated-mainboard-atmega328p-mu-qfn32-microprocessor-ti-cc2540-ble-chip-motherboard-for-ble-bluet (Year: 2021).*

International Search Report and Written Opinion—PCT/US2020/048864—ISA/EPO—dated Nov. 5, 2020.

* cited by examiner

PLAN VIEW

CURVED NOTCHES

DIFFERENT SIZED NOTCHES

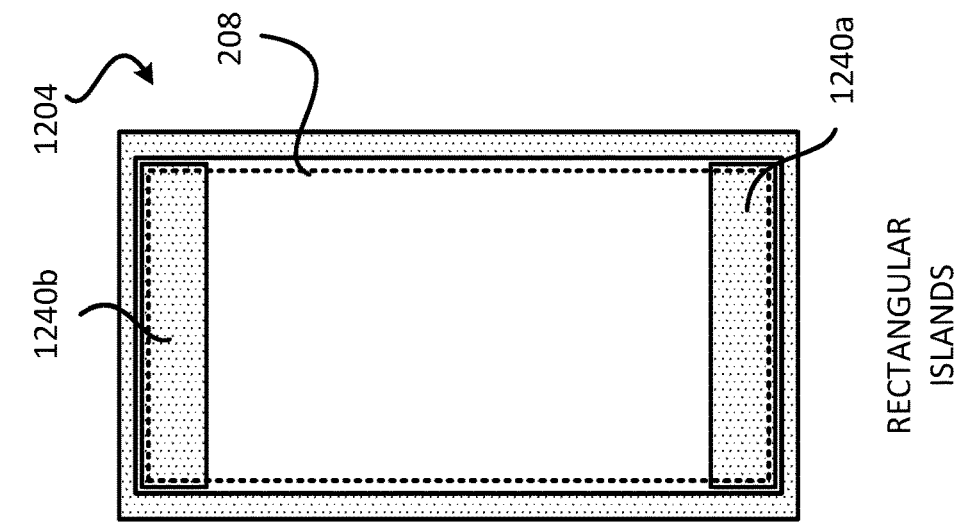
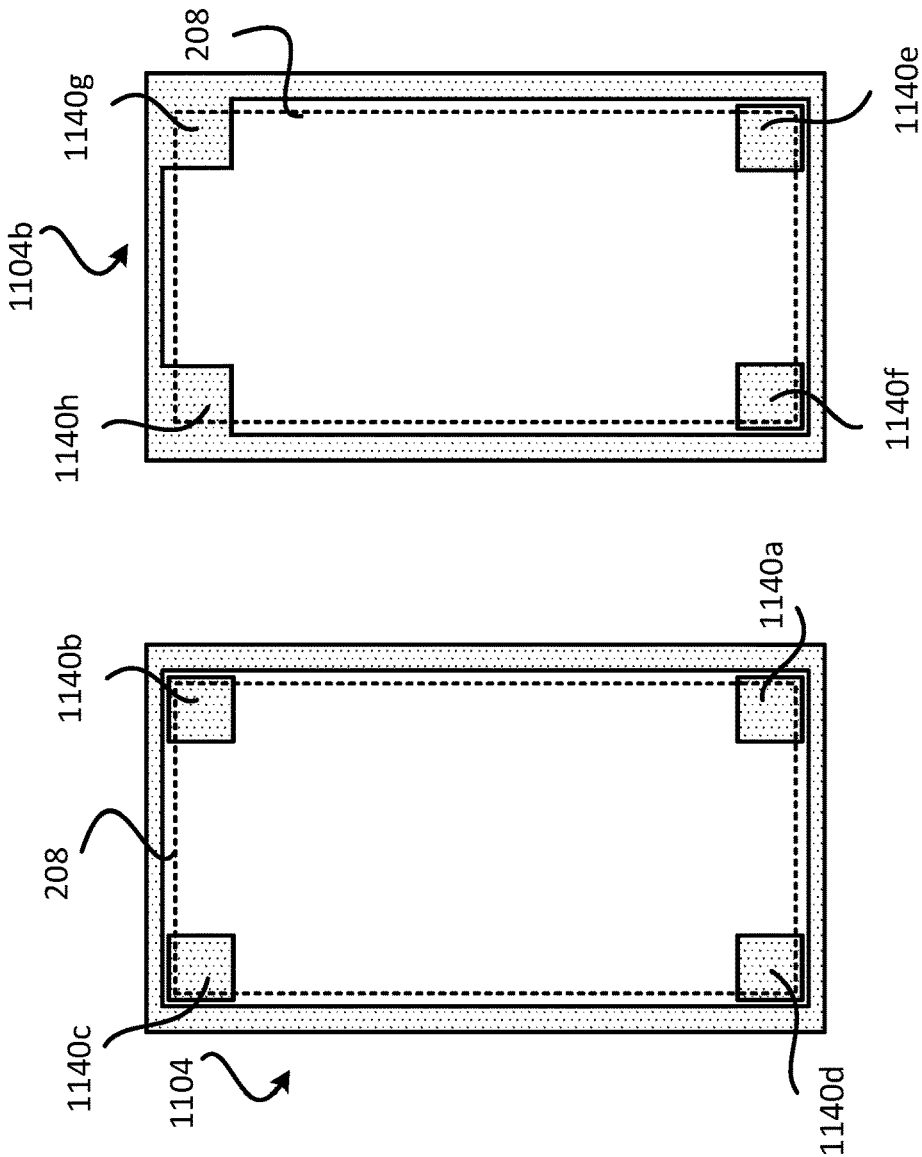
FIG. 11A
FIG. 11B
FIG. 12

PLAN VIEW

US 11,626,336 B2

PACKAGE COMPRISING A SOLDER RESIST LAYER CONFIGURED AS A SEATING PLANE FOR A DEVICE

FIELD

Various features relate to packages that includes a device, but more specifically to packages that include a solder resist layer configured as a seating plane for a device.

BACKGROUND

FIG. 1 illustrates a package 100 that includes a substrate 102, a die 104 and an encapsulation layer 160. The die 104 is coupled to a first surface of the substrate 102 through a plurality of solder interconnects 140, which may include bumps and pillars. The substrate 102 includes a plurality of dielectric layers 120 and a plurality of interconnects 122. Each layer of the dielectric layers 120 includes a patterned metal layer. The substrate 102 includes a first solder resist layer 124, a second solder resist layer 126, and a plurality of solder interconnects 130. The encapsulation layer 160 encapsulates the die 104. There is an ongoing need to improve the performance of the package.

SUMMARY

Various features relate to packages that includes a device, but more specifically to packages that include a solder resist layer configured as a seating plane for a device.

One example provides a package that includes a substrate having a first surface; a solder resist layer coupled to the first surface of the substrate; a device located over the solder resist layer such that a portion of the device touches the solder resist layer; and an encapsulation layer located over the solder resist layer such that the encapsulation layer encapsulates the device.

Another example provides an apparatus that includes a substrate having a first surface; means for providing level support coupled to the first surface of the substrate; a device located over the means for providing level support such that a portion of the device touches the means for providing level support; and means for encapsulation located over the means for providing level support such that the means for encapsulation encapsulates the device.

Another example provides a method for fabricating a package. The method provides a substrate comprising a first surface. The method forms a solder resist layer over the first surface of the substrate. The method couples a device to the substrate such that the device is located over the solder resist layer and touches the solder resist layer. The method forms an encapsulation layer over the solder resist layer such that the encapsulation layer encapsulates the device.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 11A and 11B illustrate plan views of other exemplary patterns of a solder resist layer configured as a seating plane for a device.

FIG. 12 illustrates a plan view of another exemplary pattern of a solder resist layer configured as a seating plane for a device.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate having a first surface, a solder resist layer coupled to the first surface of the substrate, and a device located over the solder resist layer such that a portion of the device touches the solder resist layer. The package also includes an encapsulation layer located over the solder resist layer such that the encapsulation layer encapsulates the device. The solder resist layer is configured as a seating plane for the device. The solder resist layer provides a layer that helps reduce, minimize and/or eliminates a tilting of the device (relative to the substrate), which may help the device perform better. For example, the device may be a radio frequency (RF) device that is sensitive to tilting. Thus, reducing, minimizing and/or eliminating the titling of the RF device relative to the substrate helps improve the performance of the RF device. The device and/or portions of the device may be located over the solder resist layer such that a surface of the device facing the substrate is approximately parallel to the first surface of the substrate. The solder resist layer includes at least one notch. The device is located over the solder resist layer such that at least one corner of the device touches the at least one notch.

Figure 1:
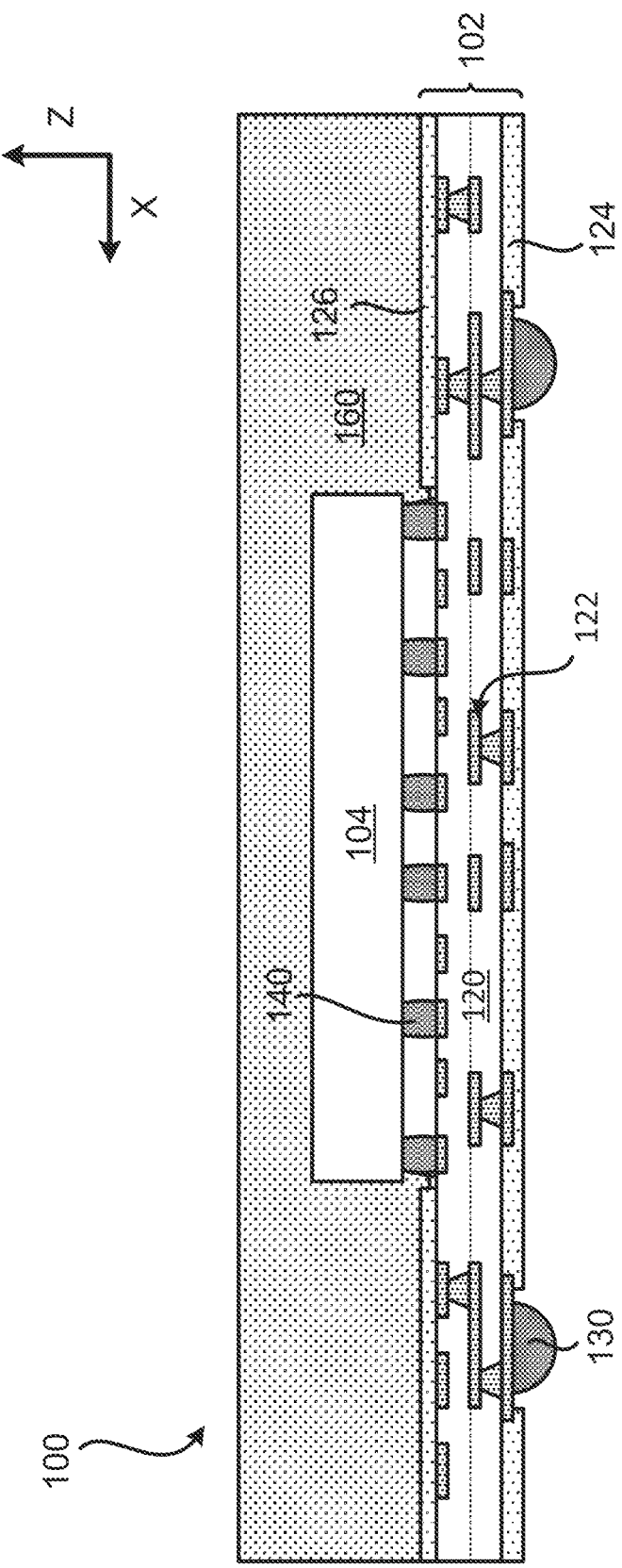
FIG. 1 illustrates a profile view of a device that includes a die and a substrate.
Figure 2:
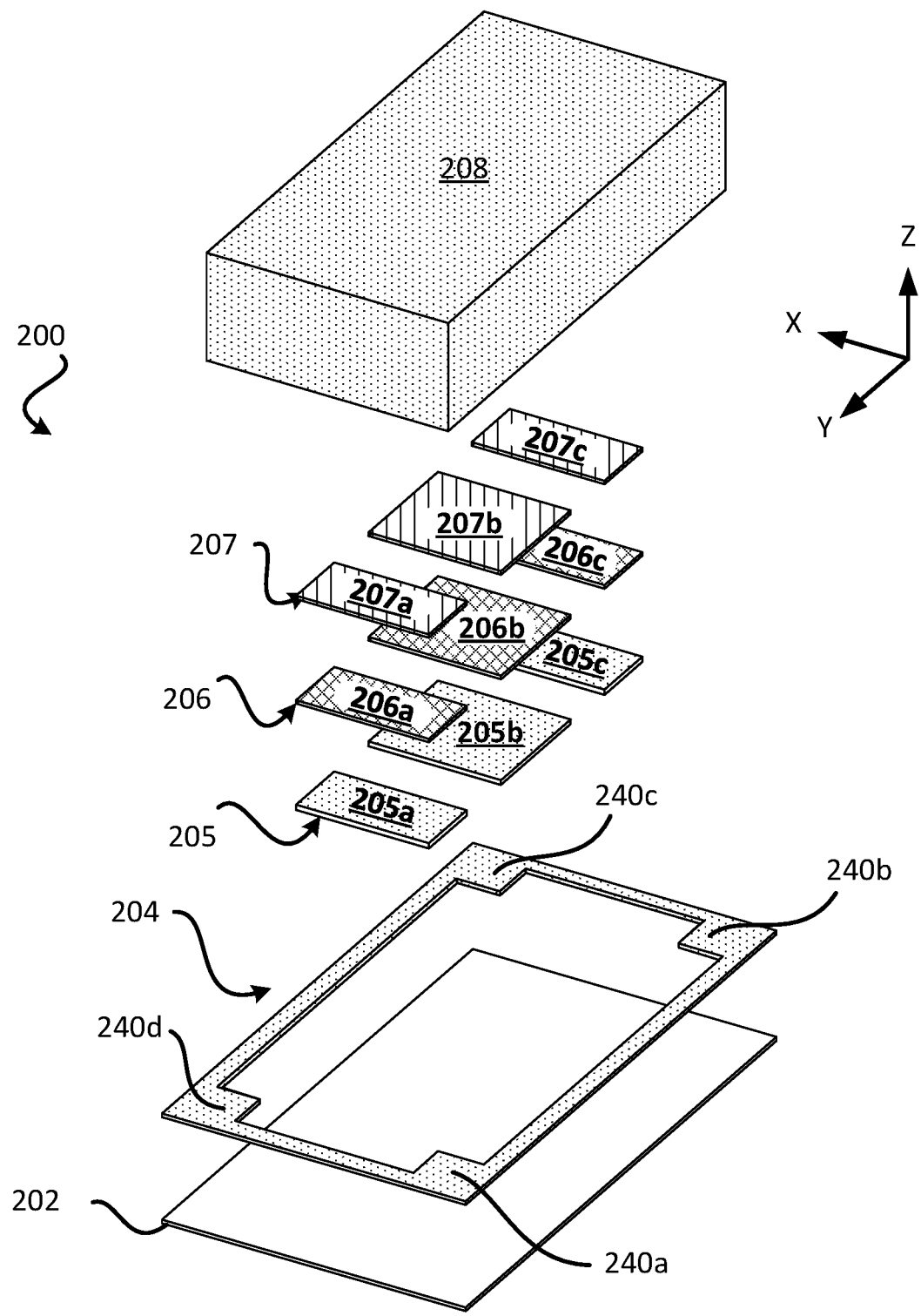
FIG. 2 illustrates an assembly view of a package that includes a solder resist layer configured as a seating plane for a device.

Exemplary Package Comprising a Solder Resist Layer Configured as a Seating Plane for a Device FIG. 2 illustrates an assembly of a package 200 that includes a solder resist layer that is configured as a seating plane for a device. The package 200 includes a substrate 202, a solder resist layer 204, substrate interconnects 205, solder interconnects 206, device interconnects 207, and a device 208. The package 200 may include a radio frequency (RF) device package.

The substrate 202 may be any type of substrate, such as a laminate substrate. The substrate 202 may include silicon and/or glass. The substrate 202 may include one or more dielectric layers. The substrate 202 may include a plurality of interconnects.

The solder resist layer 204 is coupled to a surface (e.g., first surface) of the substrate 202. The solder resist layer 204 includes a pattern and/or an opening that allows the solder resist layer 204 to be configured as a seating plane for the device 208. As will be further described below, when at least a portion of the device 208 is positioned over (e.g., resting over, placed over) the solder resist layer 204, the solder resist layer 204 is configured to act a level support for the device 208 so that a surface (e.g., surface facing the substrate 202, bottom surface, active surface) of the device 208 is parallel (or as parallel as possible) to a surface of the substrate 202. The solder resist layer 204 may be a means for providing level support.

The substrate interconnects 205 (e.g., 205*a*-205*c*), the solder interconnects 206 (e.g., 206*a*-206*c*), and the device interconnects 207 (e.g., 207*a*-207*c*) are configured to provide one or more electrical paths between the substrate 202 and the device 208. For example, the substrate interconnects 205*a*, the solder interconnects 206*a*, and the device interconnects 207*a* may be configured to provide one or more electrical paths for ground between the substrate 202 and the device 208. The substrate interconnects 205*b*, the solder interconnects 206*b*, and the device interconnects 207*b* may be configured to provide one or more electrical paths for input/output (I/O) signals between the substrate 202 and the device 208. The substrate interconnects 205*c*, the solder interconnects 206*c*, and the device interconnects 207*c* may be configured to provide one or more electrical paths for power between the substrate 202 and the device 208. However, different implementations may use different configurations and/or arrangements of interconnects to provide ground, power and/or I/O signals between the substrate 202 and the device 208.

The substrate interconnects 205 may be coupled to the first surface of the substrate 202. The substrate interconnects 205 may include one or more electrically conductive layers (e.g., metal, copper). In some implementations, the substrate interconnects 205 may be considered part of the substrate 202. The solder interconnects 206 may be coupled to the substrate interconnects 205. The device interconnects 207 may be coupled to the solder interconnects 206. The device interconnects 207 may include one or more electrically conductive layers (e.g., metal, copper). In some implementations, the device interconnects 207 may be considered part of the device 208.

The device 208 is coupled to the solder resist layer 204 and the device interconnects 207. The device 208 is located over the substrate 202 and the solder resist layer 204 such that at least a portion of the device 208 is touching (e.g., directly touching) the solder resist layer 204. In such a configuration, portions of the device 208 may be positioned (e.g., resting) over the solder resist layer 204. For example, one or more corners of the device 208 may be resting on and/or touching portions of the solder resist layer 204. Thus, one or more portions of the solder resist layer 204 may be configured as a seating plane for the device 208.

The solder resist layer 204 provides a layer that helps reduce, minimize and/or eliminates the tilting (e.g., tilting along length and/or width) of the device 208 (relative to the substrate 202), which may help the device 208 perform better. For example, the device 208 may be a radio frequency (RF) device that is sensitive to tilting. Thus, reducing, minimizing and/or eliminating the titling of the RF device relative to the substrate 202 helps improve the performance of the RF device. The device 208 may be located over the solder resist layer 204 such that a surface of the device 208 facing the substrate 202 is approximately parallel to the first surface of the substrate 202. The solder resist layer 204 includes at least one notch (e.g., 240*a*-240*d*). The device 208 may be located over the solder resist layer 204 such that at least one corner of the device 208 touches the at least one notch (e.g., 240*a*-240*d*).

The device 208 may include a radio frequency (RF) device, a die, an integrated device, a passive device, a filter, a capacitor, an inductor, an antenna, a transmitter, a receiver, and/or combinations thereof. The device 208 may be an assembly of components and/or devices.

As will be further described below in FIG. 3, the package 200 may include an encapsulation layer 209 and a shield 210. The encapsulation layer 209 may include a mold, a resin and/or an epoxy. The encapsulation layer 209 may be a means for encapsulation. The shield 210 may be an electromagnetic interference (EMI) shield. The shield 210 may be a means for shielding (e.g., means for EMI shielding). The shield 210 may be configured to be coupled to ground.

Figure 3:
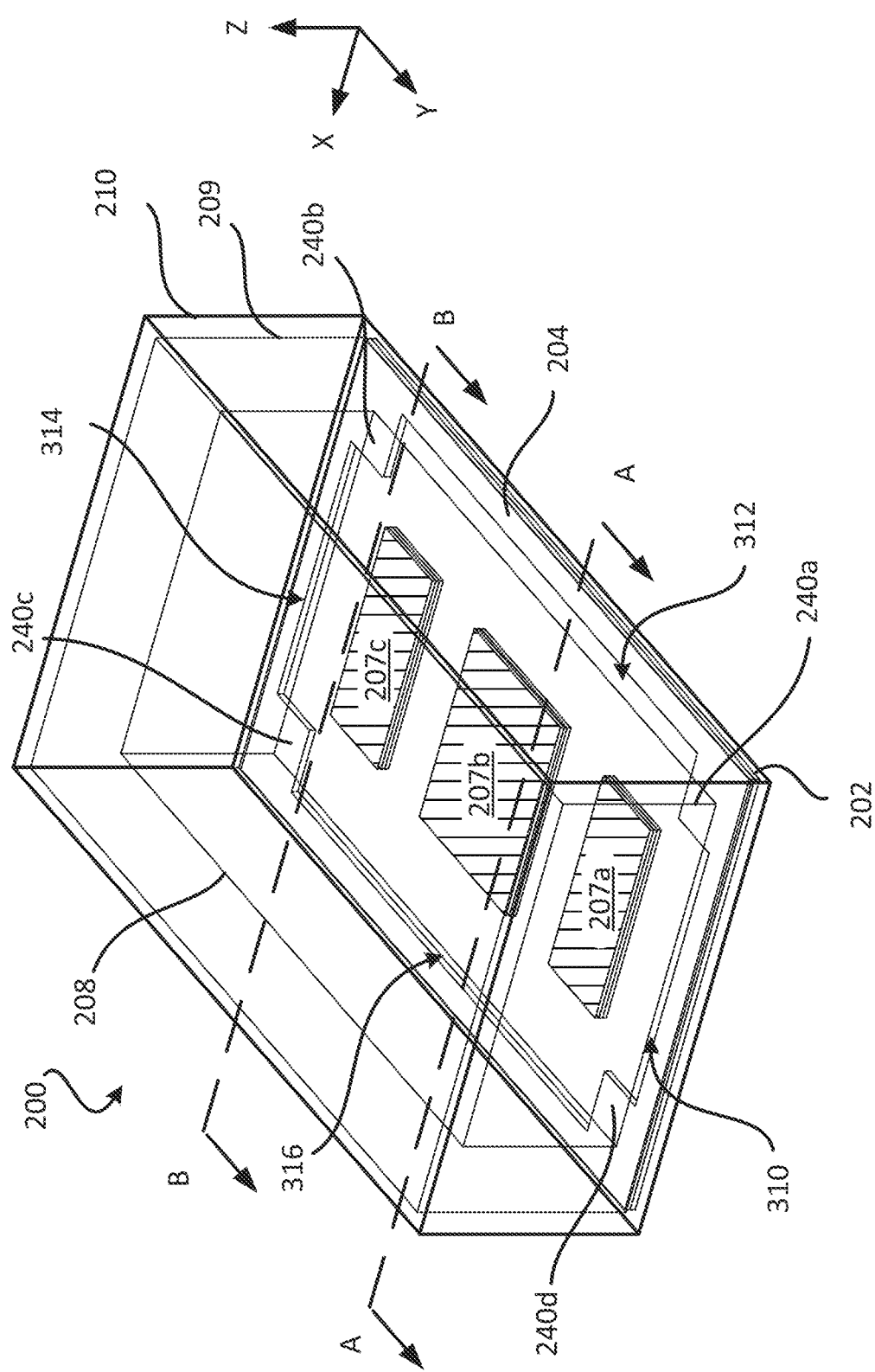
FIG. 3 illustrates a view of a package that includes a solder resist layer configured as a seating plane for a device.

FIG. 3 illustrates another view of the package 200. The package 200 includes the substrate 202, the solder resist layer 204, the substrate interconnects 205, the solder interconnects 206, the device interconnects 207, the device 208, the encapsulation layer 209 and the shield 210. It is noted that the solder resist layer 204 may be considered part of the substrate 202.

As described above, the solder resist layer 204 includes notches (e.g., a first notch 240*a*, second notch 240*b*, a third notch 240*c*, a fourth notch 240*d*). The solder resist layer 204 is disposed over the substrate 202. The device 208 is coupled to the first surface of the substrate 202 such that portions of the device 208 is touching the solder resist layer 204. For example, (i) a first corner of the device 208 may be resting on and/or touching the first notch 240*a* of the solder resist layer 204, (ii) a second corner of the device 208 may be resting on and/or touching the second notch 240*b* of the solder resist layer 204, (iii) a third corner of the device 208 may be resting on and/or touching the third notch 240*c* of the solder resist layer 204, and/or (iv) a fourth corner of the device 208 may be resting on and/or touching the fourth notch 240*d* of the solder resist layer 204. The solder resist layer 204, and in particular, the notches (e.g., 240*a*-240*d*) are configured as a means for providing level support, which helps prevent the device 208 from excessively tilting. In some implementations, the use of the solder resist layer 204 as a seating plane for the device 208 helps a surface of the device 208 to be within 2 degrees or less of being parallel to the first surface of the substrate 202. Thus, for example, the solder resist layer 205 may help prevent the device 208 from tilting by more than 2 degrees from the substrate 202.

FIG. 3 illustrates that the device 208 is positioned over the substrate 202 and the solder resist layer 204 such that there is at least one gap between a surface of the device 208 and a surface of the solder resist layer 204. For example, FIG. 3 illustrates a first gap 310, a second gap 312, a third gap 314, and a fourth gap 316 between a lateral surface (e.g., side surface) of the device 208 and a surface (e.g., lateral surface) of the solder resist layer 204. As will be further described below, the one or more gaps (e.g., 310, 312, 314, 316) may be configured to allow the encapsulation layer 209 to form between the device 208 and the substrate 202 (e.g., in a space that is not already occupied by interconnects and the solder resist layer 204).

FIG. 3 illustrates the encapsulation layer 209 is formed over the substrate 202 and the solder resist layer 204 such that the encapsulation layer 209 encapsulates the device 208. For example, the encapsulation layer 209 may be located over the solder resist layer 204 such that the encapsulation layer 209 encapsulates the device 208. The encapsulation layer 209 may be formed and located in and round the gaps (e.g., 310, 312, 314, 316). The encapsulation layer 209 may be formed and located between the substrate 202 and surface (e.g., bottom surface) of the device 208. In some implementations, the encapsulation layer 209 may be provided between the device 208 and the substrate 202 through the one or more gaps (e.g., 310, 312, 314, 316). In some implementations, the encapsulation layer 209 is provided such that a space between the device 208 and the substrate 202 is substantially free of voids (e.g., air gaps). Substantially free of voids may mean that voids represent five percent (5%) or less of the space between device 208 and the substrate 202. This is possible because the encapsulation layer 209 is able to enter through the one or more gaps and settle in the unoccupied between the substrate 202 and the device 208. Reducing, minimizing, and/or eliminating voids between the substrate 202 and the device 208 may be important when the device 208 include RF components that are sensitive to different materials. The encapsulation layer 209 and voids have different properties that may affect the performance of device 208. For example, a part of the device 208 that is near a void may perform differently than another part of the device 208 that is near an encapsulation layer 209. In order to provide a device 208 that performs consistently, it may be important to make sure to reduce, minimize and/or eliminate voids between the substrate 202 and the device 208. In some implementations, there is five percent (5%) or less voids in the space between the substrate 202 and the device 208. The solder resist layer 204 and the interconnects (e.g., 205, 206, 207) between the substrate 202 and the device 208 shall not be considered voids.

The shield 210 may be formed over a surface of the encapsulation layer 209, a side surface of the solder resist layer 204, and/or a side surface of the substrate 202. The shield 210 may be an electromagnetic interference (EMI) shield. The shield 210 may be a means for shielding (e.g., means for EMI shielding). The shield 210 may be configured as a Faraday cage. The shield 210 may include an electric conductive material (e.g., metal). The shield 210 may be coupled to ground. The shield 210 may be patterned.

Figure 4:
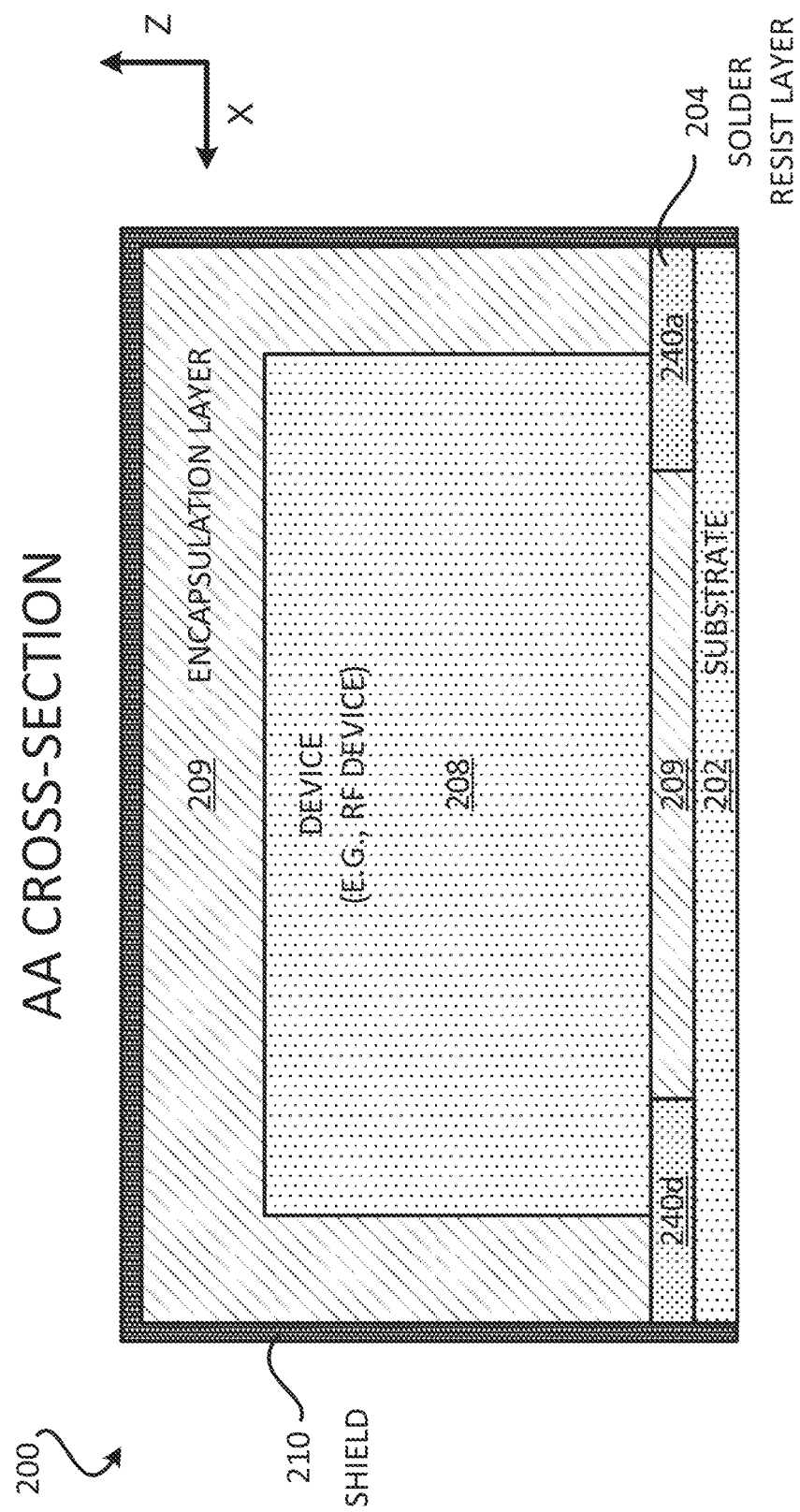
FIG. 4 illustrates a profile view of an AA cross section of a package that includes a solder resist layer configured as a seating plane for a device.

FIG. 4 illustrates a profile view across an AA cross section of the package 200. As shown in FIG. 4, the device 208 is located over the substrate 202 and the solder resist layer 204 such that the solder resist layer 204 is configured as a seating plane for the device 208. As shown in FIG. 4, the device 208 is located over the solder resist layer 204 such that a portion of the device 208 touches the solder resist layer 204. In this example, a first corner of the device 208 is touching the first notch 240a of the solder resist layer 204, and a second corner of the device 208 is touching the fourth notch 240d. This configuration allows the device 208 to be as parallel as possible to the substrate 202. For example, this configuration allows a surface (e.g., bottom surface, top surface) of the device 208 to be as parallel as possible to a surface of the substrate 202. In some implementations, the device 208 and/or a surface of the device 208 is within 2 degrees of being parallel to the substrate 202 and/or a surface of the substrate 202. The tilt angle of the device 208 relative to the substrate 202 may be approximately 2 degrees or less.

Figure 5:
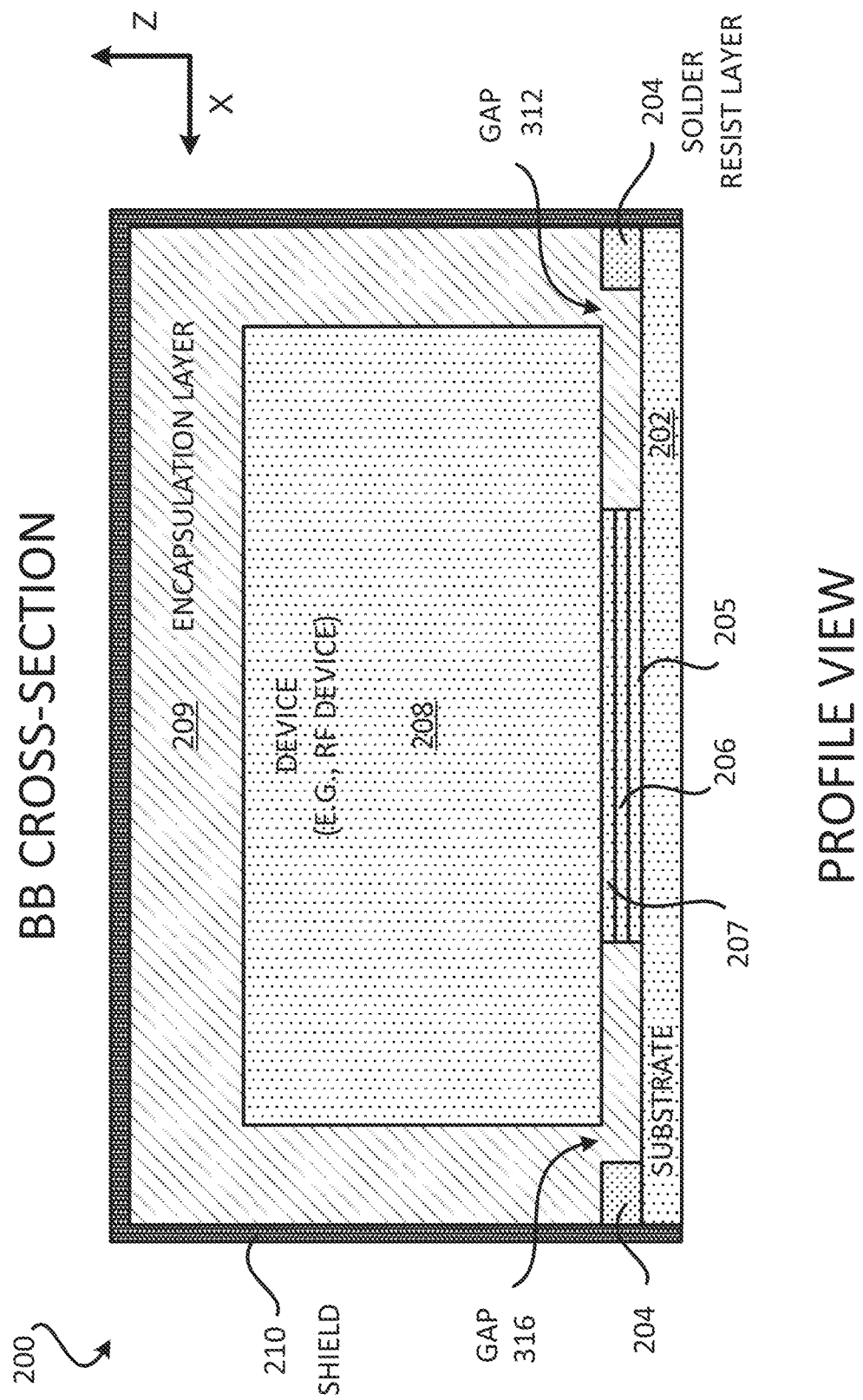
FIG. 5 illustrates a profile view of a BB cross section of a package that includes a solder resist layer configured as a seating plane for a device.

FIG. 5 illustrates a profile view across a BB cross section of the package 200. As shown in FIG. 5, the device 208 is located over the substrate 202. The device 208 is electrically coupled to substrate through the interconnects (205, 206, 207). The device 208 is positioned over the substrate 202 such that there is at least one gap (e.g., second gap 312, fourth gap 316) between the device 208 and the solder resist layer 204. The gap(s) are configured to allow the encapsulation layer 209 to be formed underneath the device 208, and between the device 208 and the substrate 202. The gap(s) may have a width of at least 15 micrometers (μm). In some implementations, the gap(s) (e.g., 310, 312, 314, 316) may have a width in a range of about 15-60 micrometers (μm).

FIGS. 4 and 5 illustrate the shield 210 formed over a surface (e.g., outer surface) of the encapsulation layer 209, a side surface of the solder resist layer 204, and/or a side surface of the substrate 202. The shield 210 may be patterned.

Figure 6:
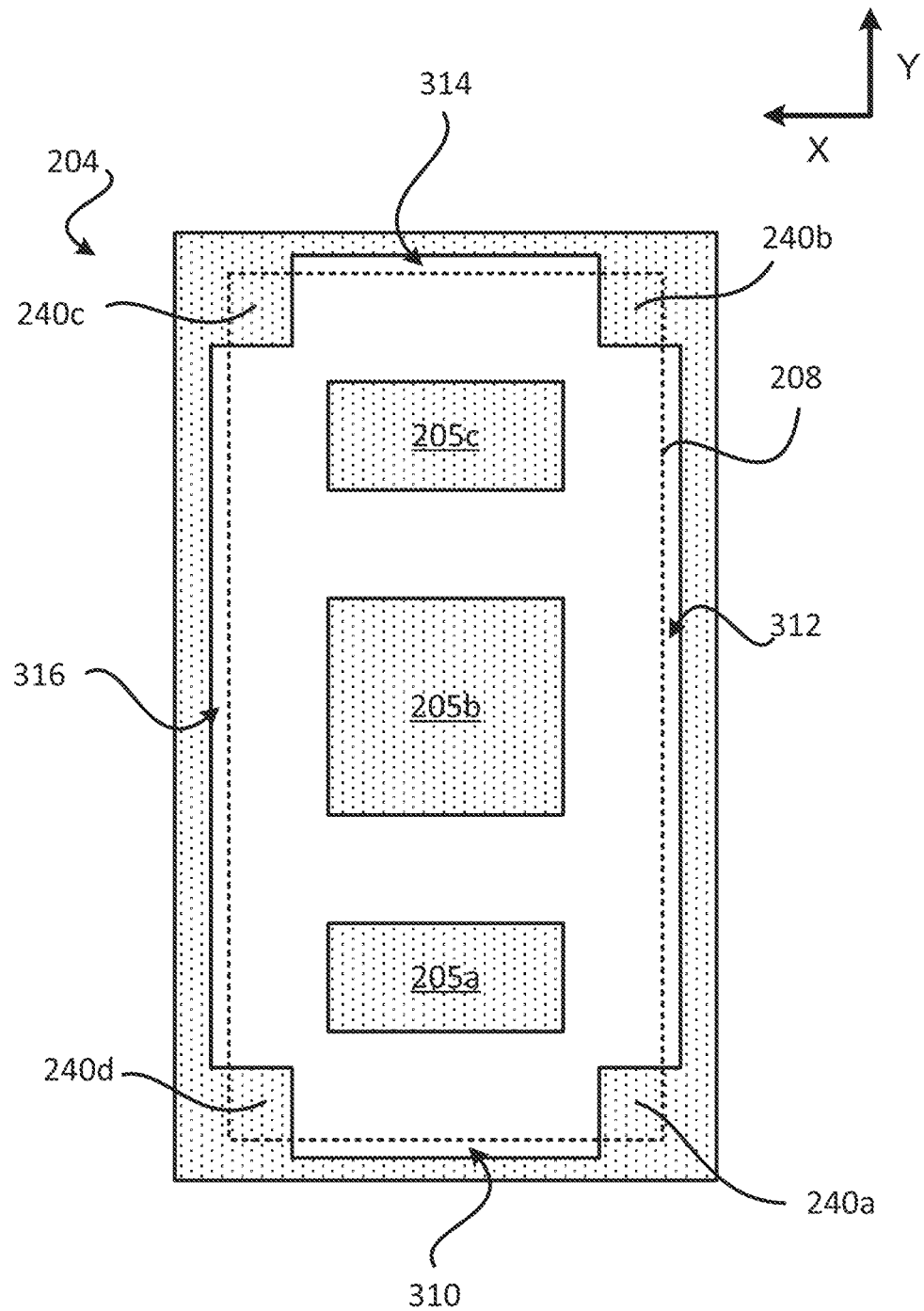
FIG. 6 illustrates a plan view of a package that includes a solder resist layer configured as a seating plane for a device.

FIG. 6 illustrates a plan view of how the device 208 may be positioned over the substrate 202 and the solder resist layer 204. As shown in FIG. 6, in one example, the device 208 may be positioned over the substrate 202 and the solder resist layer 204, such that (i) a first corner of the device 208 may be resting on and/or touching the first notch 240a of the solder resist layer 204, (ii) a second corner of the device 208 may be resting on and/or touching the second notch 240b of the solder resist layer 204, (iii) a third corner of the device 208 may be resting on and/or touching the third notch 240c of the solder resist layer 204, and/or (iv) a fourth corner of the device 208 may be resting on and/or touching the fourth notch 240d of the solder resist layer 204. Moreover, the device 208 may be positioned over the substrate 202 and the solder resist layer 204 such that there is a first gap 310, a second gap 312, a third gap 314 and a fourth gap 316 for the encapsulation layer 209 to enter and settle between the device 208 and the substrate 202. The first gap 310, the second gap 312, the third gap 314 and/or the fourth gap 316 may be filled with the encapsulation layer 209.

The use of a solder resist layer configured as a seating plane provides several technical advantages, such as (i) reducing, minimizing, and/or eliminating tilting or excessive tilting of the device relative to a substrate, (ii) reducing, minimizing, and/or eliminating voids or excessive voids between the substrate and the device, (iii) reducing, minimizing, and/or eliminating variations in the device height from tilting, (iv) reducing, minimizing, and/or eliminating inconsistencies in the encapsulation layer between the substrate and the device, and/or (v) reducing, minimizing, and/or eliminating variations in the performance of the device.

FIGS. 2-6 illustrate examples of the patterned solder resist layer 204. However, different implementations may use a solder resist layer that has different patterns and/or openings. FIGS. 7-12 illustrate various solder resist layers with different patterns and/or openings, that may be implemented with the package 200 or any package described in the disclosure. FIGS. 7-12 also illustrate how the device 208 may be touching and/or resting over the various solder resist layers.

Figure 7:
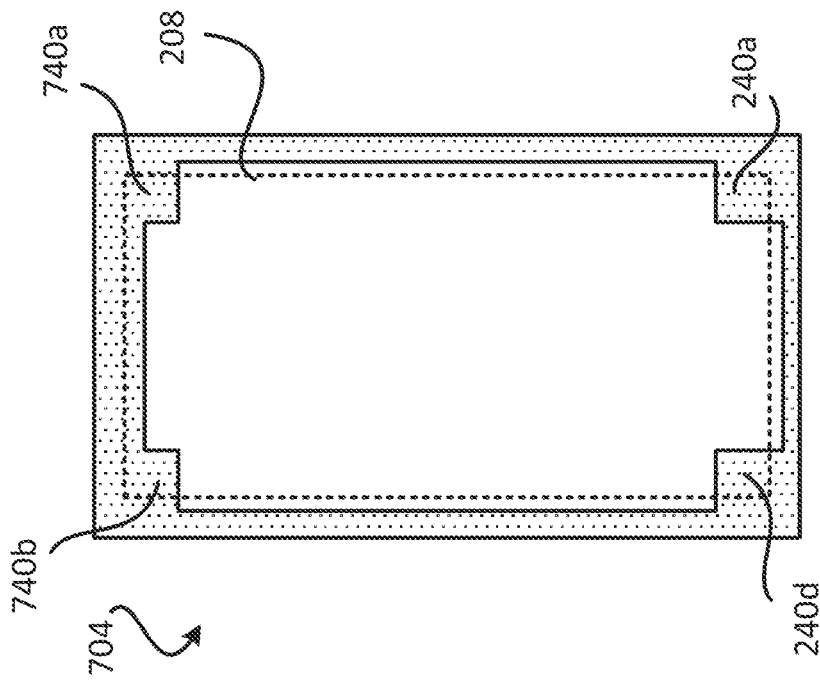
FIG. 7 illustrates a plan view of an exemplary pattern of a solder resist layer configured as a seating plane for a device.

FIG. 7 illustrates a solder resist layer 704 that includes the first notch 240a, a second notch 740a, the third notch 740b, and the fourth notch 240d. The second notch 740a and the third notch 740b may have a different size than the first notch 240a and the fourth notch 240d.

Figure 8:
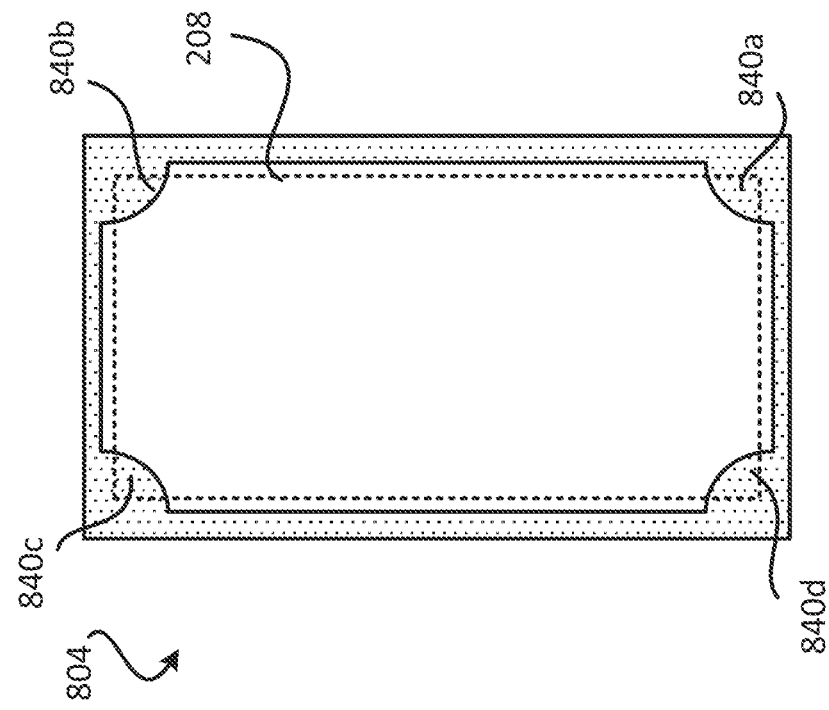
FIG. 8 illustrates a plan view of another exemplary pattern of a solder resist layer configured as a seating plane for a device.

FIG. 8 illustrates a solder resist layer 804 that includes a first notch 840a, a second notch 840b, a third notch 840c, and a fourth notch 840d. The first notch 840a, the second notch 840b, the third notch 840c, and the fourth notch 840d may have a curved shape and/or an arc shape. The size of the notches may be the same or different.

Figure 10:
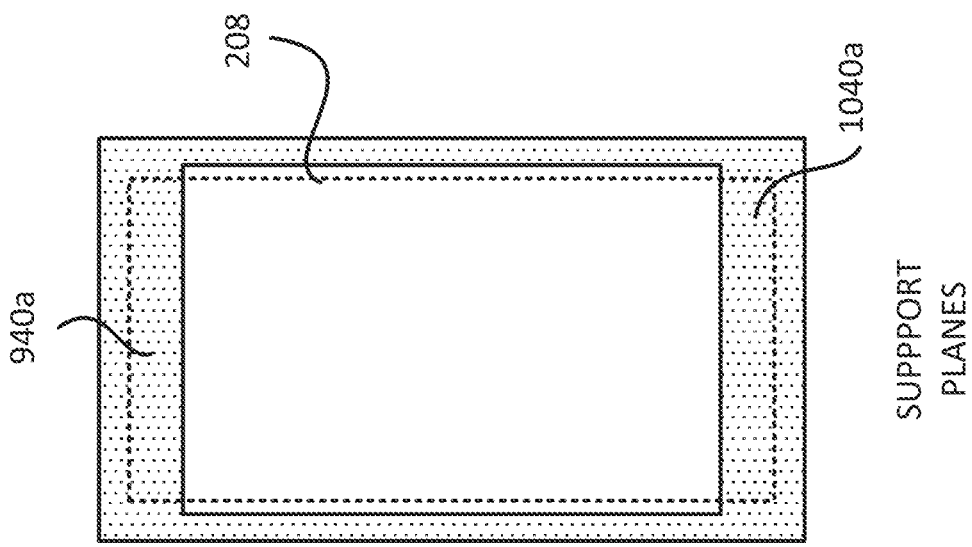
FIG. 10 illustrates a plan view of another exemplary pattern of a solder resist layer configured as a seating plane for a device.
Figure 9:
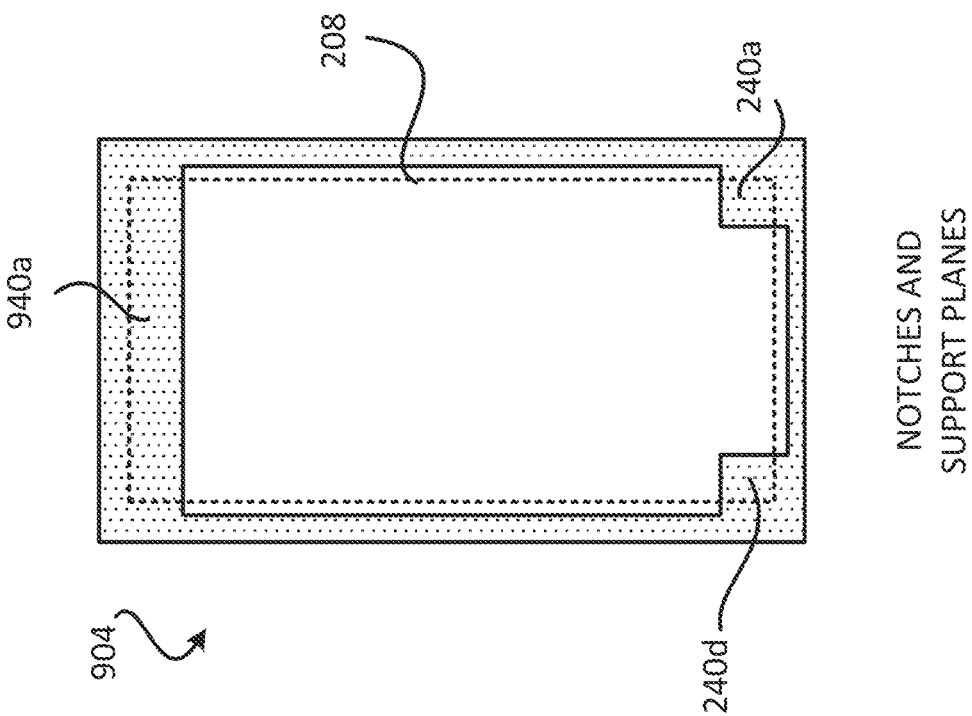
FIG. 9 illustrates a plan view of another exemplary pattern of a solder resist layer configured as a seating plane for a device.

FIG. 9 illustrates a solder resist layer 904 that includes the first notch 240a, the fourth notch 240d, and a first portion 940a. One or more portions of the device 208 may be touching the first notch 240a, the fourth notch 240d, and/or the first portion 940a. FIG. 10 illustrates a solder resist layer 1004 that includes the first portion 940a and the second portion 1040a. One or more portions of the device 208 may be touching the first portion 940a and/or the second portion 1040a.

FIG. 11 illustrates a solder resist layer 1104 that includes a first island 1140a (e.g., solder resist island), a second island 1140b (e.g., solder resist island), a third island 1140c, and a fourth island 1140d. One or more portions of the device 208 may be touching the first island 1140a, the second island 1140b, the third island 1140c, and/or the fourth island 1140d.

FIG. 12 illustrates a solder resist layer 1204 that includes a first island 1240a and a second island 1240b. The first island 1240a and the second island 1240b have a rectangular shape. One or more portions of the device 208 may be touching the first island 1240a and/or the second island 1240b.

It is noted that different implementations may use a solder resist layer that includes different combinations of notches, planes, and/or islands (as for example illustrated in FIG. 11B illustrating a solder resist layer 1104b that includes a first island 1140e (e.g., solder resist island), a second island 1140f (e.g., solder resist island), a first notch 1140g, and a second notch 1140h and device outline 208). Moreover, the location of the notches, planes, and/or islands may vary. The number of notches, planes and/or islands may also vary. The size and/or shape of the notches, planes, and/or islands may vary.

Figure 13:
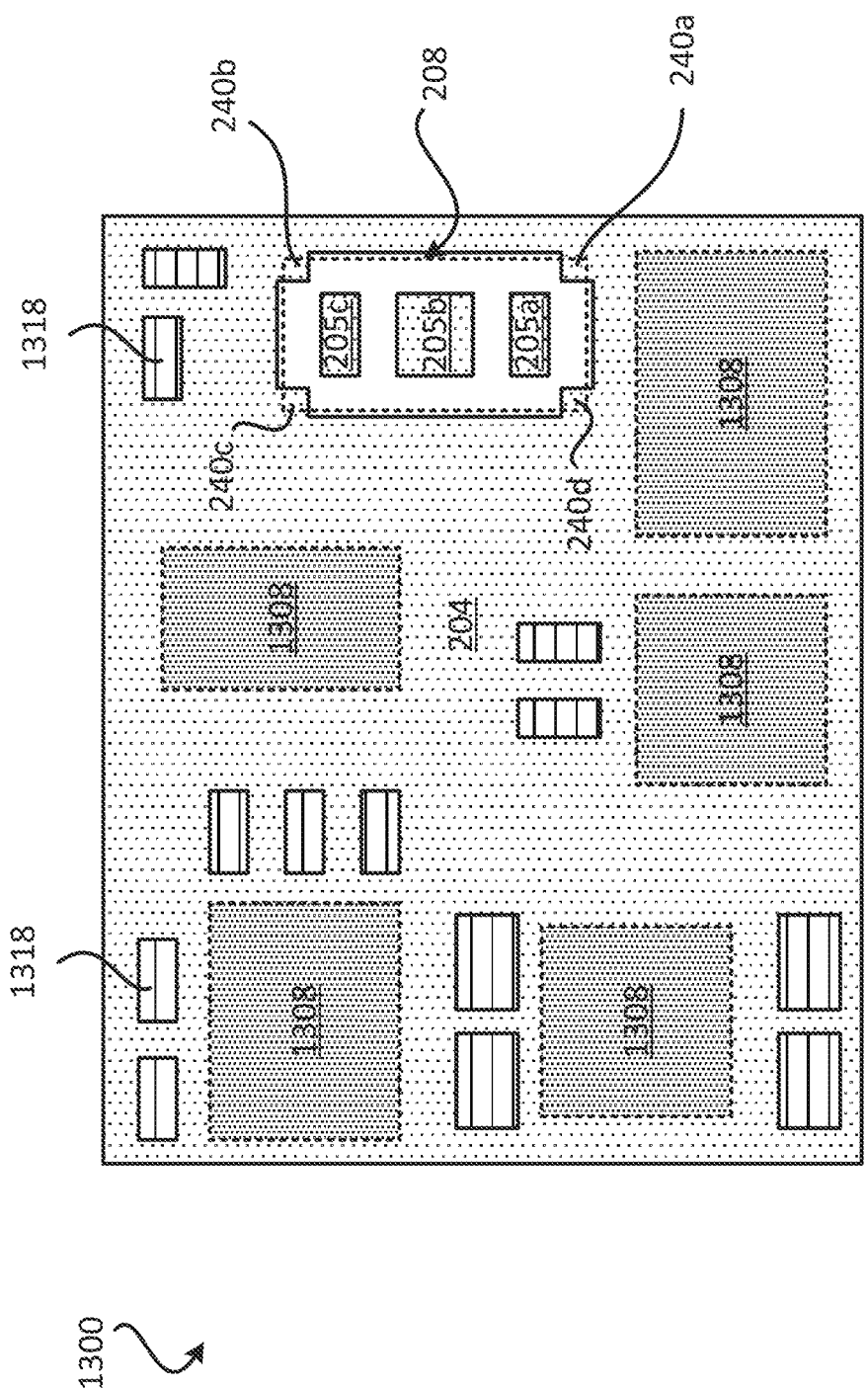
FIG. 13 illustrates a plan view of a package that includes a solder resist layer configured as a seating plane for a device.

FIGS. 2-6 illustrate a package 200 that includes a device 208. It is noted that the package 200 may include several components, such as other devices, dies, integrated devices, capacitors and/or inductors. FIG. 13 illustrates a package 1300 that includes several devices 1308, capacitors 1318, the solder resist layer 204 and the device 208. The package 1300 may include similar or the same components of the package 300. The devices 1308 may include dies and/or integrated devices. The device 208 is positioned over the solder resist layer 204 such that portions of the device 208 are over the notches (e.g., 240a-240d). The solder resist layer 204 of the package 1300 may be configured as a seating plane for the device 208.

Having described various packages that include a solder resist layer configured as a seating plane for a device, a sequence for fabricating a package that includes a solder resist layer configured as a seating plane for a device will now be described below.

Exemplary Sequence for Fabricating a Package Comprising a Solder Resist Layer Configured as a Seating Plane for a Device FIG. 14 (which includes FIGS. 14A-14D) illustrates an exemplary sequence for providing or fabricating a package that includes a solder resist layer configured as a seating plane for a device. In some implementations, the sequence of FIGS. 14A-14D may be used to provide or fabricate the package 200 of FIG. 3, or any of the packages described in the disclosure.

It should be noted that the sequence of FIGS. 14A-14D may combine one or more stages in order to simplify and/or clarify the sequence for providing or fabricating the package that includes a solder resist layer configured as a seating plane for a device. In some implementations, the order of the processes may be changed or modified. In some implementations, one or more of processes may be replaced or substituted without departing from the spirit of the disclosure. However, different implementations may fabricate a package differently.

Figure 14A:
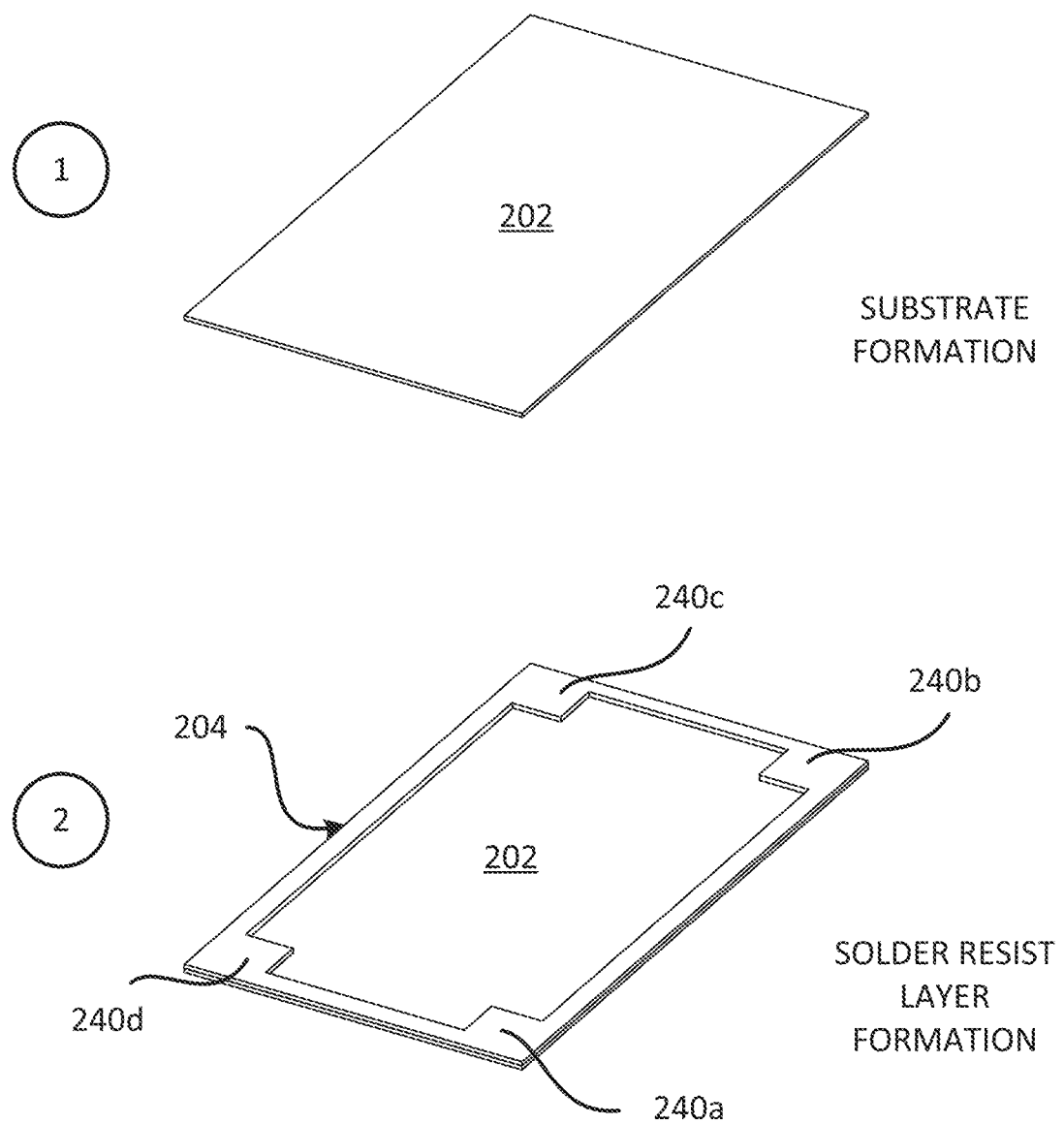
FIG. 14 (comprising FIGS. 14A-14D) illustrates an exemplary sequence for fabricating a package that includes a solder resist layer configured as a seating plane for a device.

Stage 1, as shown in FIG. 14A, illustrates a state after a substrate 202 is provided. The substrate 202 may include one or more dielectric layers and a plurality of interconnects. The substrate 202 may include silicon. The substrate 202 may be fabricated. In some implementations, fabricating the substrate 202 may include using a semi additive process (SAP) and/or a modified semi additive process (mSAP).

Stage 2 illustrates a state after a solder resist layer 204 is disposed (e.g., formed) over the substrate 202. The solder resist layer 204 may be configured to operate as a seating plane for a device (e.g., 208). The solder resist layer 204 includes notches (e.g., 240a-240d). Different implementations may use a solder resist layer with different patterns and/or openings, such as the solder resist layers described in FIGS. 7-12. The solder resist layer may include a notch, a plane and/or an island.

Figure 14B:
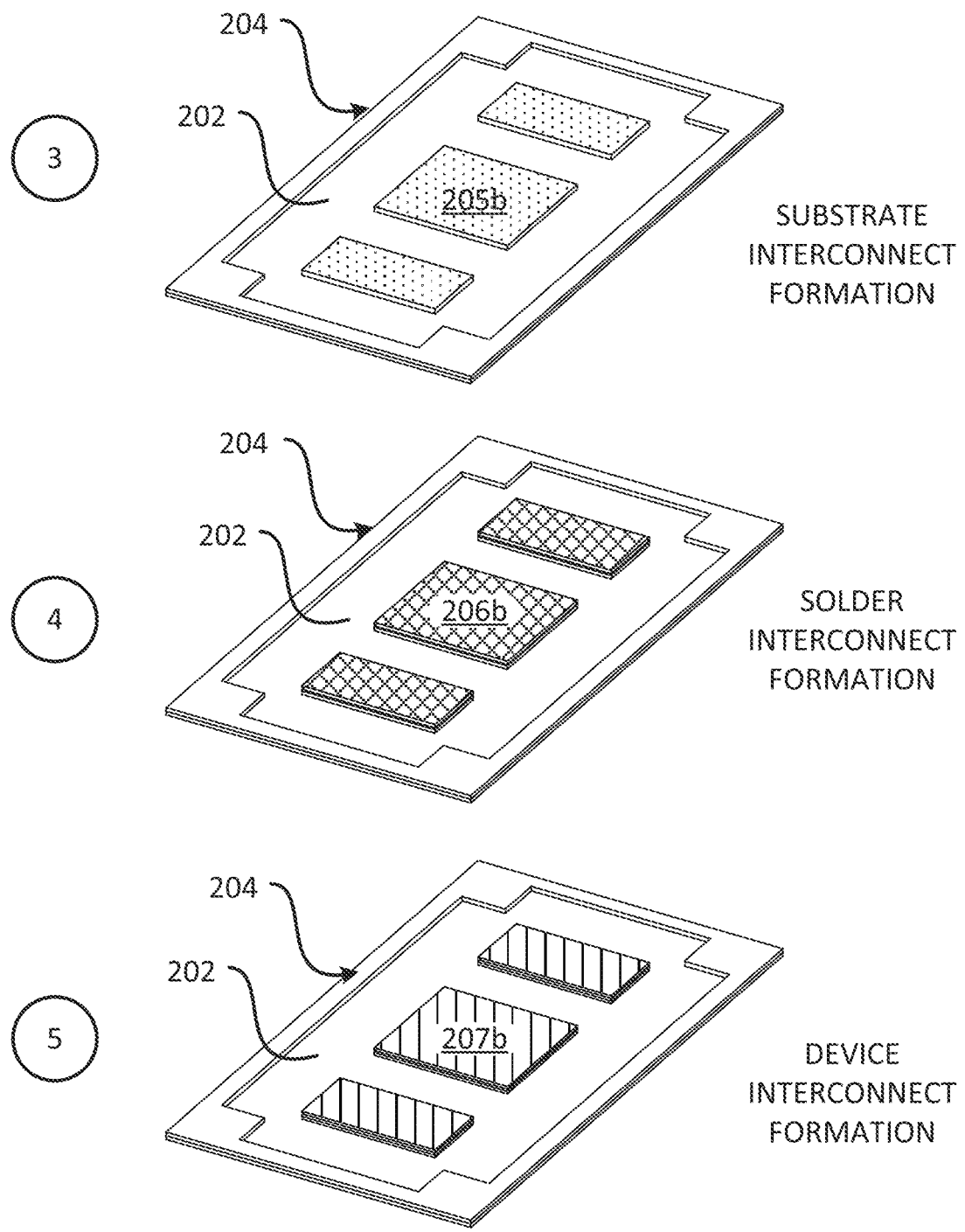

Stage 3, as shown in FIG. 14B, illustrates a state after the substrate interconnects 205 are disposed (e.g., formed) over the substrate 202. A plating process may be used to form the substrate interconnects 205. In some implementations, the substrate interconnects 205 may be disposed before the solder resist layer 204 is formed over the substrate 202. In some implementations, the substrate 202 may include the substrate interconnects 205 when the substrate 202 is provided at Stage 1.

Stage 4 illustrates a state after the solder interconnects 206 are disposed (e.g., formed) over the substrate interconnects 205. A pasting process may be used to form the solder interconnects 206 over the substrate interconnects 205.

Stage 5 illustrates a state after the device interconnects 207 are disposed (e.g., formed) over the solder interconnects 206. A plating process may be used to form the device interconnects 207 over the solder interconnects 206. In some implementations, the device interconnects 207 may be considered part of the device 208. In such an instance, the device interconnects 207 may be coupled to the solder interconnects 206 when the device 208 is coupled to the substrate 202 and the solder resist layer 204.

Figure 14C:
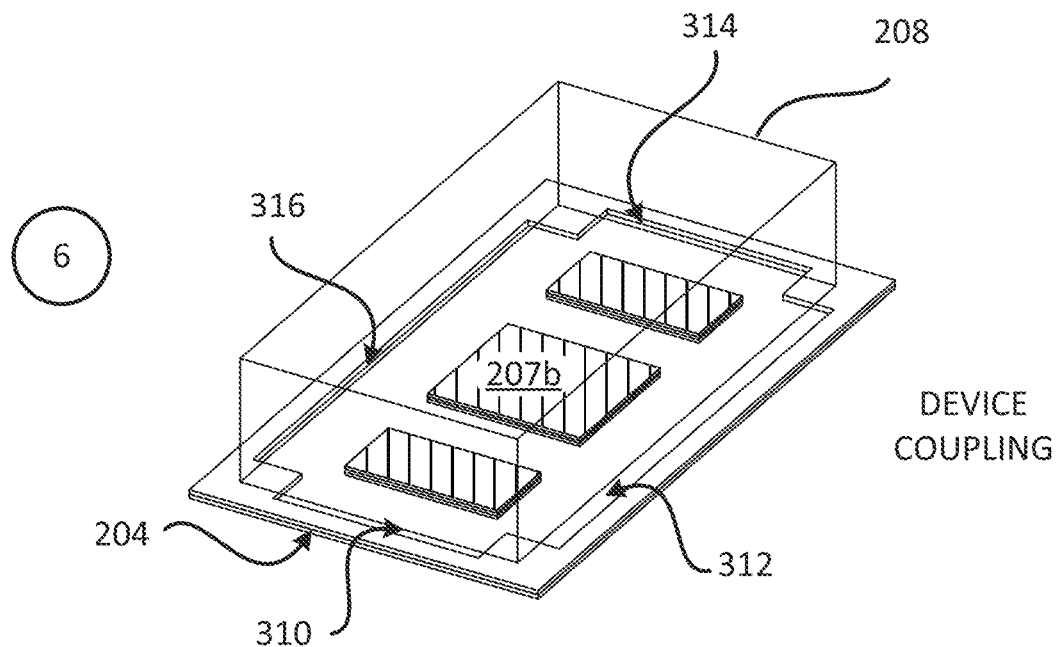
Figure 14C:
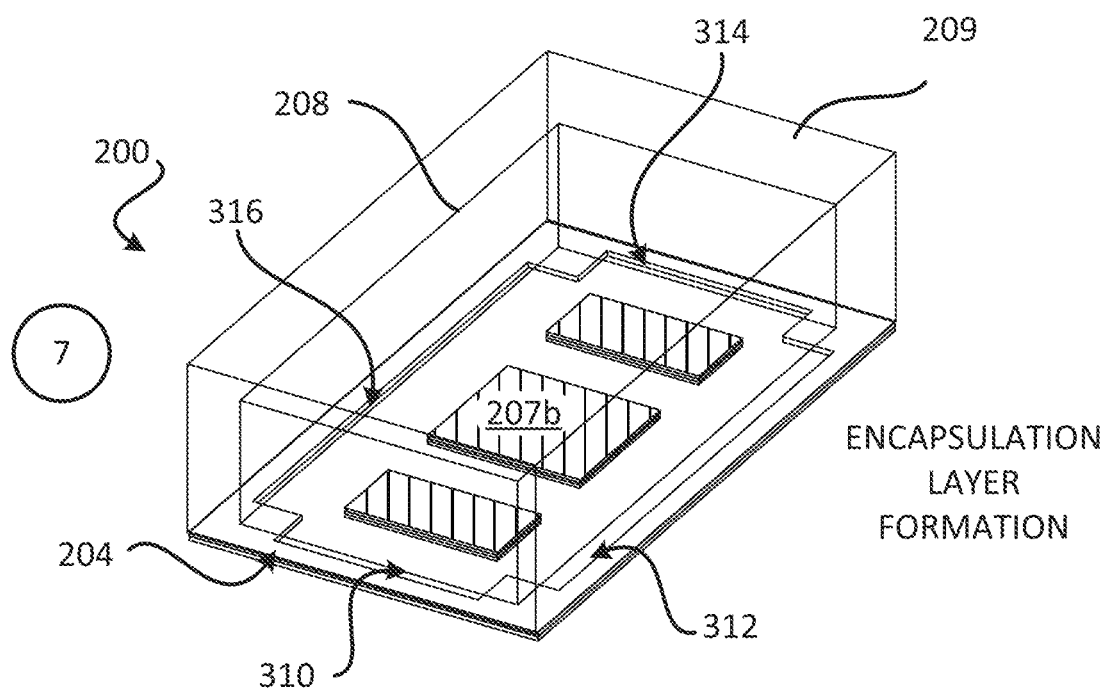

Stage 6, as shown in FIG. 14C, illustrates a state the device 208 is coupled to the substrate 202 and the solder resist layer 204. The device 208 may be coupled through a pick and place process. The device 208 may be configured to be electrically coupled to the device interconnects 207, the solder interconnects 206 and the substrate interconnects 205. The device 208 is positioned over the substrate 202 and the solder resist layer 204 such that (i) a first corner of the device 208 may be resting on and/or touching the first notch 240a of the solder resist layer 204, (ii) a second corner of the device 208 may be resting on and/or touching the second notch 240b of the solder resist layer 204, (iii) a third corner of the device 208 may be resting on and/or touching the third notch 240c of the solder resist layer 204, and/or (iv) a fourth corner of the device 208 may be resting on and/or touching the fourth notch 240d of the solder resist layer 204.

As shown at Stage 6, the notches of the solder resist layer 204 are configured as seating plane for the device 208, helping reduce, minimize and/or eliminate the tilt of the device 208 relative to the substrate 202.

Moreover, the device 208 may be positioned over the substrate 202 and the solder resist layer 204 such that there is a first gap 310, a second gap 312, a third gap 314 and a fourth gap 316 between surfaces of the device 208 and surface of the solder resist layer 204. As will be further described below, the gaps (e.g., 210, 312, 314, 316) may be used to allow an encapsulation layer to travel underneath the device 208, reducing, minimizing, and/or eliminating voids between the device 208 and the substrate 202.

The device 208 may include a radio frequency (RF) device, a die, an integrated device, a passive device, a filter, a capacitor, an inductor, an antenna, a transmitter, a receiver, and/or combinations thereof. The device 208 may be an assembly of components and/or devices.

Stage 7 illustrates a state after the encapsulation layer 209 is formed over the substrate 202, the solder resist layer 204 and the device 208. The encapsulation layer 209 is formed such that the encapsulation layer 209 encapsulates the device 208. Moreover, the encapsulation layer 209 may be formed and located in the gaps (e.g., 310, 312, 314, 316) and between the substrate 202 and the device 208. Different implementations may provide and form the encapsulation layer 209 differently. Some implementations may use a compression and transfer molding process, a sheet molding process, or a liquid molding process to provide and form the encapsulation layer 209. Stage 7 may illustrate an example of a package 200 that includes a solder resist layer configured as a seating plane for a device.

Figure 14D:
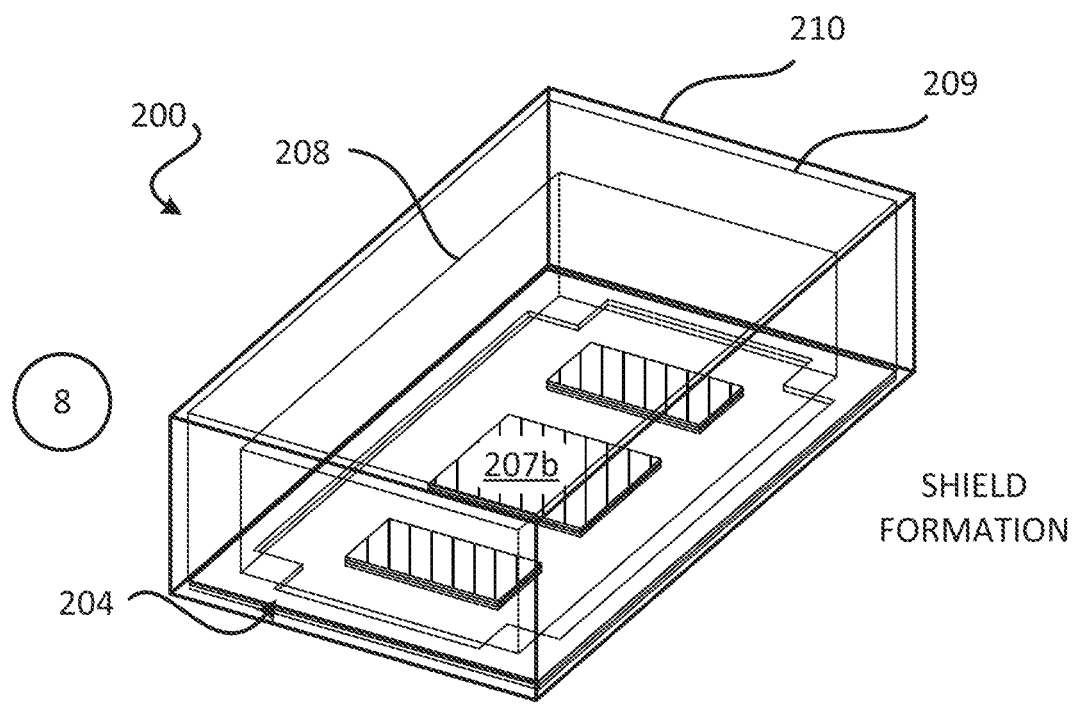

Stage 8, as shown in FIG. 14D, illustrates a state after the shield 210 is formed over the encapsulation layer 209. The shield 210 may be an EMI shield. The shield 210 may include one or more electrically conductive material (e.g., metal). The shield 210 may be formed over a side surface of the solder resist layer 204 and/or a side surface of the substrate 202. A plating process and/or a sputtering process may be used to form the shield 210. The shield 210 may be a patterned shield. The shield 210 may be formed such that the shield 210 is configured to be coupled to ground. Stage 8 may illustrate an example of a package 200 that includes a solder resist layer configured as a seating plane for a device.

Figure 15:
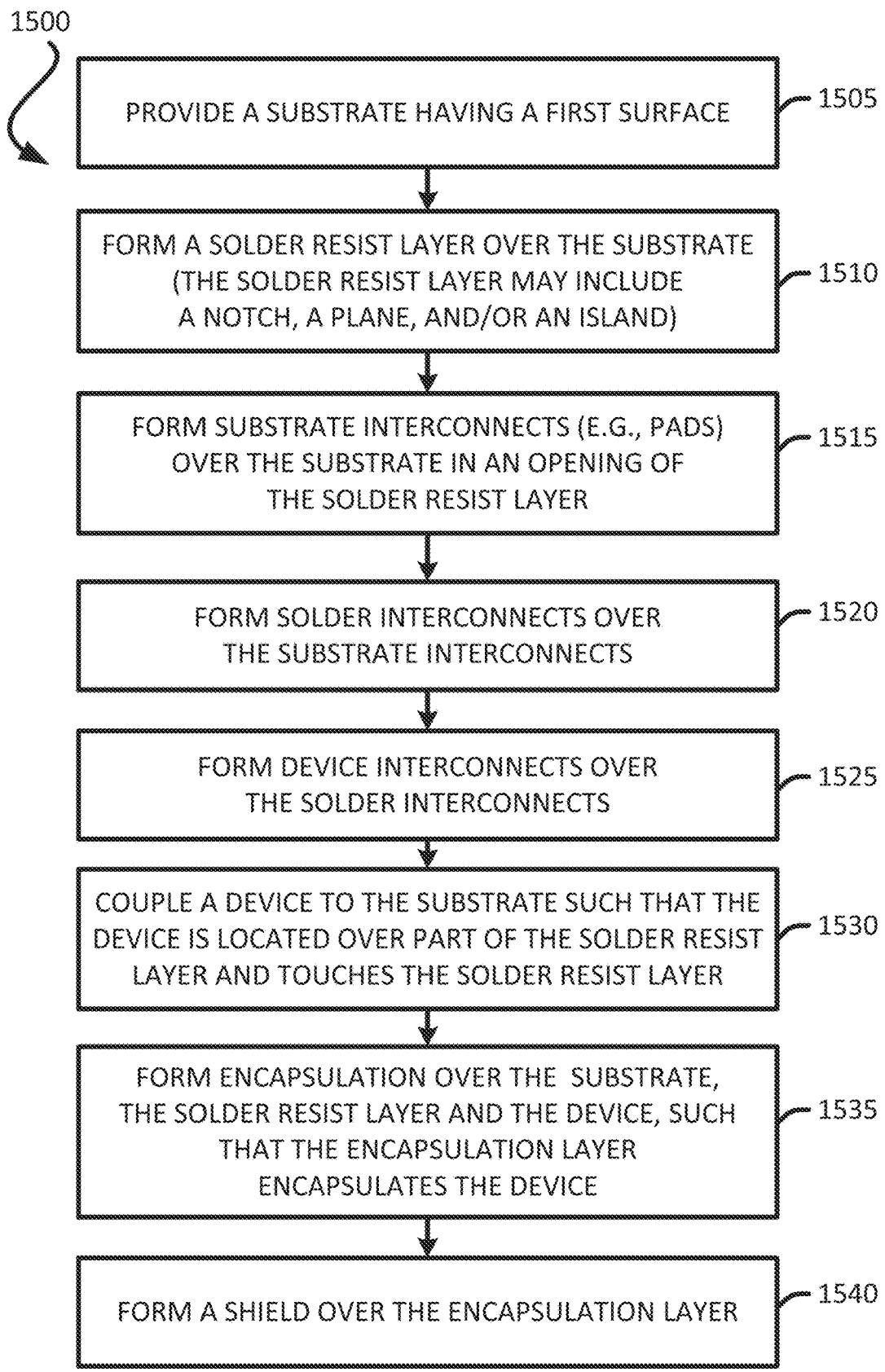
FIG. 15 illustrates an exemplary flow diagram of a method for fabricating a package that includes a solder resist layer configured as a seating plane for a device.

Exemplary Flow Diagram of a Method for Fabricating a Package Comprising a Solder Resist Layer Configured as a Seating Plane for a Device In some implementations, fabricating a package that includes a solder resist layer configured as a seating plane for a device includes several processes. FIG. 15 illustrates an exemplary flow diagram of a method 1500 for providing or fabricating package that includes a solder resist layer configured as a seating plane for a device. The method 1500 of FIG. 15 may be used to provide or fabricate the package 200 of FIG. 3 described in the disclosure. However, the method 1500 may be used to provide or fabricate any of the packages described in the disclosure.

It should be noted that the sequence of FIG. 15 may combine one or more processes in order to simplify and/or clarify the method for providing or fabricating a package that includes a solder resist layer configured as a seating plane for a device. In some implementations, the order of the processes may be changed or modified. In some implementations, one or more of processes may be replaced or substituted without departing from the spirit of the disclosure. However, different implementations may fabricate a package differently.

The method provides (at 1505) a substrate (e.g., 202). The substrate 202 may include one or more dielectric layers and a plurality of interconnects. The substrate 202 may include a first surface and a second surface. The substrate 202 may be fabricated. In some implementations, fabricating the substrate 202 may include using a semi additive process (SAP) and/or a modified semi additive process (mSAP).

The method forms (at 1510) a solder resist layer (e.g., 204) over the first surface of the substrate (e.g., 202). The pattern and/or opening of the solder resist layer may vary with different implementations. Stage 2 of FIG. 14A illustrates an example of a solder resist layer 204 disposed (e.g., formed) over the substrate 202. The solder resist layer 204 may be configured to operate as a seating plane for a device (e.g., 208). The solder resist layer 204 includes notches (e.g., 240a-240d). Different implementations may use a solder resist layer with different patterns and/or openings, such as the solder resist layers described in FIGS. 7-12. A solder resist layer may include a notch, a plane, an island, and/or combination thereof.

The method forms (at 1515) substrate interconnects (e.g., 205) over the substrate 202. Stage 3 of FIG. 14B illustrates an example of the substrate interconnects 205 disposed (e.g., formed) over the substrate 202. A plating process may be used to form the substrate interconnects 205. In some implementations, the substrate interconnects 205 may be disposed before the solder resist layer 204 is formed over the substrate 202. In some implementations, the substrate 202 may include the substrate interconnects 205 when the substrate 202 is provided at Stage 1 of FIG. 14A.

The method forms (at 1520) solder interconnects (e.g., 206) over the substrate interconnects 205. Stage 4 of FIG. 14B illustrates an example of the solder interconnects 206 disposed (e.g., formed) over the substrate interconnects 205. A pasting process may be used to form the solder interconnects 206 over the substrate interconnects 205.

The method forms (at 1525) device interconnects (e.g., 207) over the solder interconnects 206. Stage 5 of FIG. 14B illustrates an example of the device interconnects 207 disposed (e.g., formed) over the solder interconnects 206. A plating process may be used to form the device interconnects 207 over the solder interconnects 206. In some implementations, the device interconnects 207 may be considered part of the device 208. In such an instance, the device interconnects 207 may be coupled to the solder interconnects 206 when the device 208 is coupled to the substrate 202 and the solder resist layer 204.

The method couples (at 1530) the device (e.g., 208) to the substrate such that at least a portion of the device is located over the solder resist layer and touches the solder resist layer. Stage 6 of FIG. 14C illustrates an example of the device 208 coupled to the substrate 202 and the solder resist layer 204. The device 208 may be coupled to the substrate through a pick and place process.

The device 208 may be configured to be electrically coupled to the device interconnects 207, the solder interconnects 206 and the substrate interconnects 205. The device 208 is positioned over the substrate 202 and the solder resist layer 204 such that (i) a first corner of the device 208 may be resting on and/or touching the first notch 240a of the solder resist layer 204, (ii) a second corner of the device 208 may be resting on and/or touching the second notch 240b of the solder resist layer 204, (iii) a third corner of the device 208 may be resting on and/or touching the third notch 240c of the solder resist layer 204, and/or (iv) a fourth corner of the device 208 may be resting on and/or touching the fourth notch 240d of the solder resist layer 204.

The notches of the solder resist layer 204 are configured as seating plane for the device 208, reducing, minimizing and/or eliminating the tilt of the device 208 relative to the substrate 202.

The device 208 may be positioned over the substrate 202 and the solder resist layer 204 such that there is a first gap 310, a second gap 312, a third gap 314 and a fourth gap 316 between surfaces of the device 208 and surface of the solder resist layer 204.

The device 208 may include a radio frequency (RF) device, a die, an integrated device, a passive device, a filter, a capacitor, an inductor, an antenna, a transmitter, a receiver, and/or combinations thereof. The device 208 may be an assembly of components and/or devices.

The method forms (at 1535) an encapsulation layer (e.g., 209) over the solder resist layer 204 and/or the substrate 202 such that the encapsulation layer encapsulates the device 208. Stage 7 as shown in FIG. 14C, illustrates an example of the encapsulation layer 209 formed over the substrate 202, the solder resist layer 204 and the device 208. The encapsulation layer 209 is formed such that the encapsulation layer 209 encapsulates the device 208. Moreover, the encapsulation layer 209 may be formed and located in the gaps (e.g., 310, 312, 314, 316) and between the substrate 202 and the device 208. The gaps (e.g., 210, 312, 314, 316) may be used to allow an encapsulation layer to travel underneath the device 208, reducing, minimizing, and/or eliminating voids between the device 208 and the substrate 202. Different implementations may provide and form the encapsulation layer 209. Some implementations may use a compression and transfer molding process, a sheet molding process, or a liquid molding process to provide and form the encapsulation layer 209.

The method forms (at 1540) a shield (e.g., 210) over a surface of the encapsulation layer (e.g., 209). Stage 8 of FIG. 14D, illustrates an example of the shield 210 formed over the encapsulation layer 209. The shield 210 may be an EMI shield. The shield 210 may include one or more electrically conductive material (e.g., metal). The shield 210 may be formed over a side surface of the solder resist layer 204 and/or a side surface of the substrate 202. A plating process and/or a sputtering process may be used to form the shield 210. The shield 210 may be a patterned shield. The shield 210 may be formed such that the shield 210 is configured to be coupled to ground.

Exemplary Electronic Devices

Figure 16:
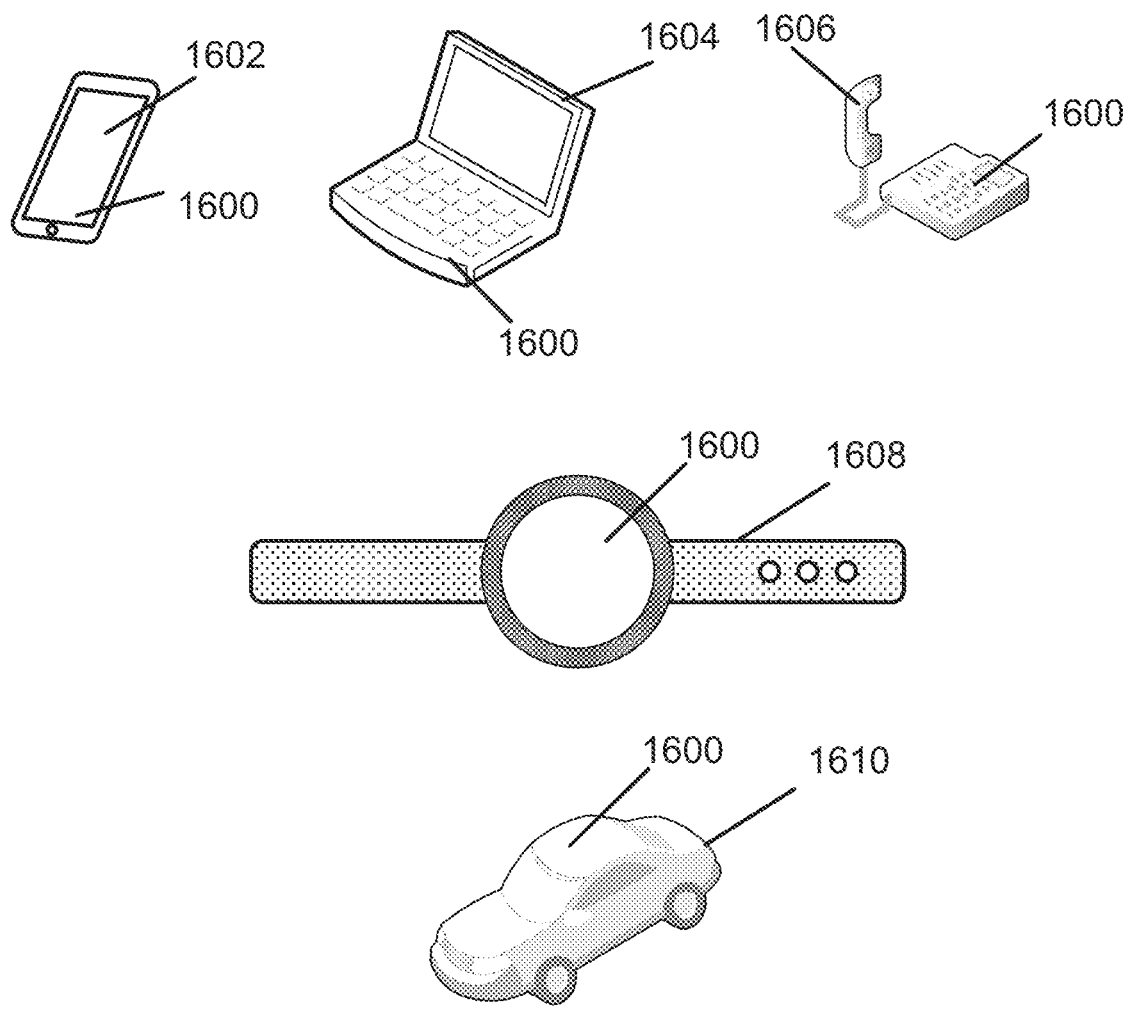
FIG. 16 illustrates various electronic devices that may integrate a die, an integrated device, an integrated passive device (IPD), a passive component, a package, and/or a device package described herein.

FIG. 16 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1602, a laptop computer device 1604, a fixed location terminal device 1606, a wearable device 1608, or automotive vehicle 1610 may include a device 1600 as described herein. The device 1600 may be, for example, any of the devices and/or packages described herein. The electronic devices 1602, 1604, 1606 and 1608 and the vehicle 1610 illustrated in FIG. 16 are merely exemplary. Other electronic devices may also feature the device 1600 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-13, 14A-14D, and/or 15-16 may be rearranged and/or combined into a single component, process, feature or function or embodied in several components, processes, or functions. Additional elements, components, processes, and/or functions may also be added without departing from the disclosure. It should also be noted FIGS. 2-13, 14A-14D, and/or 15-16 and its corresponding description in the present disclosure is not limited to dies and/or ICs. In some implementations, FIGS. 2-13, 14A-14D, and/or 15-16 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "encapsulating" means that the object may partially encapsulate or completely encapsulate another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a signal (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects. The process of forming and/or disposing an encapsulation layer may include using a compression and transfer molding process, a sheet molding process, or a liquid molding process.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package comprising:
   a substrate comprising a first surface;
   a solder resist layer coupled to the first surface of the substrate, the solder resist layer having a plurality of sides that define an interior opening in the solder resist layer that is enclosed by the plurality of sides of the solder resist layer, the interior opening free of any solder resist, the solder resist layer comprising at least one notch at a perimeter of the interior opening, the at least one notch formed from the solder resist layer and forming a protrusion into the interior opening;
   a device located over the solder resist layer such that a portion of the device touches the solder resist layer, the portion of the device including at least one corner of the device that touches the at least one notch;
   one or more interconnects configured to provide one or more electrical paths between the substrate and the device, the one or more interconnects positioned within the interior opening between the device and the substrate, wherein there is a gap within the interior opening that is between the one or more interconnects and the solder resist layer; and
   an encapsulation layer located over the solder resist layer such that the encapsulation layer encapsulates the device.

2. The package of claim 1, wherein the solder resist layer is configured as a seating plane for the device.

3. The package of claim 1, wherein the device is located over the solder resist layer such that a surface of the device facing the substrate is within 2 degrees of being parallel to the first surface of the substrate.

4. The package of claim 1, wherein the encapsulation layer is further located between the device and the substrate within the interior opening of the solder resist layer.

5. The package of claim 1, wherein the encapsulation layer is located between the device and the substrate such that a space between the device and the substrate is substantially free of voids.

6. The package of claim 1, further comprising a lateral gap between a side of the device and one of the plurality of sides of the solder resist layer, wherein the lateral gap is filled with the encapsulation layer.

7. The package of claim 1, wherein the device comprises a radio frequency (RF) device, a die, an integrated device, a passive device, a filter, a capacitor, an inductor, an antenna, a transmitter, a receiver, and/or combinations thereof.

8. The package of claim 1, wherein the package is incorporated into a unit selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a component in an automotive vehicle.

9. The package of claim 1, wherein edges of the device extend beyond each side of the one or more interconnects.

10. The package of claim 1, wherein the device has a device surface that faces the first surface of the substrate, wherein the device surface includes the portion of the device that touches the solder resist layer, wherein a second portion of the device surface that does not touch the solder resist layer has a greater area than the portion of the device that touches the solder resist layer.

11. The package of claim 1, wherein the solder resist layer comprises at least one other notch at the perimeter of the interior opening formed from the solder resist layer and forming another protrusion into the interior opening, wherein the portion of the device that touches the solder resist layer further includes at least one other corner of the device that touches the at least one other notch.

12. An apparatus comprising:
   a substrate comprising a first surface;
   means for providing level support coupled to the first surface of the substrate, the means for providing level support having a plurality of sides that define an interior opening in the means for providing level support that is enclosed by the plurality of sides of the means for providing level support, the interior opening free of the means for providing level support, the means for providing level support comprising at least one notch at a perimeter of the interior opening, the at least one notch formed from the means for providing level support and forming a protrusion into the interior opening;
   a device located over the means for providing level support such that a portion of the device touches the means for providing level support, the portion of the device including at least one corner of the device that touches the at least one notch;

one or more interconnects configured to provide one or more electrical paths between the substrate and the device, the one or more interconnects positioned within the interior opening between the device and the substrate, wherein there is a gap within the interior opening that is between the one or more interconnects and the means for providing level support; and means for encapsulation located over the means for providing level support such that the means for encapsulation encapsulates the device.

13. The apparatus of claim 12, wherein the means for providing level support is configured as a seating plane for the device.

14. The apparatus of claim 12, wherein the device is located over the means for providing level support such that a surface of the device facing the substrate is within 2 degrees of being parallel to the first surface of the substrate.

15. The apparatus of claim 12, wherein the means for encapsulation is further located between the device and the substrate.

16. The apparatus of claim 12, wherein the means for encapsulation is located between the device and the substrate such that a space between the device and the substrate is substantially free of voids.

17. The apparatus of claim 12, further comprising a lateral gap between a side of the device and one of the plurality of sides of the means for providing level support.

18. The apparatus of claim 12, wherein the device comprises a radio frequency (RF) device, a die, an integrated device, a passive device, a filter, a capacitor, an inductor, an antenna, a transmitter, a receiver, and/or combinations thereof.

19. The apparatus of claim 12, wherein the apparatus is incorporated into a unit selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a component in an automotive vehicle.

20. A method for fabricating a package, comprising:
providing a substrate comprising a first surface;
forming a solder resist layer over the first surface of the substrate, the solder resist layer being formed to have a plurality of sides that define an interior opening in the solder resist layer that is enclosed by the plurality of sides of the solder resist layer, the interior opening free of any solder resist, the solder resist layer being formed to include at least one notch at a perimeter of the interior opening, the at least one notch formed from the solder resist layer and forming a protrusion into the interior opening;

forming one or more interconnects configured to provide one or more electrical paths between the substrate and a device, the one or more interconnects formed within the interior opening between the device and the substrate, wherein there is a gap within the interior opening that is between the one or more interconnects and the solder resist layer;

coupling the device to the substrate such that the device is located over the solder resist layer and a portion of the device touches the solder resist layer, the portion of the device including at least one corner of the device that touches the at least one notch; and forming an encapsulation layer over the solder resist layer such that the encapsulation layer encapsulates the device.

21. The method of claim 20, wherein the solder resist layer is configured as a seating plane for the device.

22. The method of claim 20, wherein the device is coupled over the solder resist layer such that a surface of the device facing the substrate is within 2 degrees of being parallel to the first surface of the substrate.

23. The method of claim 20, wherein the encapsulation layer is formed such that the encapsulation layer is further located between the device and the substrate.

24. The method of claim 20, wherein the encapsulation layer is formed such that the encapsulation layer is located between the device and a space between the device and the substrate is substantially free of voids.

25. The method of claim 20, wherein the device is coupled to the substrate such that there is a lateral gap between a side of the device and one of the plurality of sides of the solder resist layer.

26. The method of claim 20, wherein the device comprises a radio frequency (RF) device, a die, an integrated device, a passive device, a filter, a capacitor, an inductor, an antenna, a transmitter, a receiver, and/or combinations thereof.

27. An apparatus comprising:
a substrate comprising a first surface;
a solder resist layer coupled to the first surface of the substrate, the solder resist layer having a plurality of sides that define an interior opening in the solder resist layer that is enclosed by the plurality of sides of the solder resist layer, the interior opening free of any solder resist, the solder resist layer further having:
a first notch formed from the solder resist layer and protruding into the interior opening;
a second notch formed from the solder resist layer and protruding into the interior opening;
a third notch formed from the solder resist layer and protruding into the interior opening; and
a fourth notch formed from the solder resist layer and protruding into the interior opening;
a device located over the solder resist layer such that a first corner of a bottom surface of the device facing the substrate touches the first notch, a second corner of the bottom surface of the device touches the second notch, a third corner of the bottom surface of the device touches the third notch, and a fourth corner of the bottom surface of the device touches the fourth notch, wherein there is a first lateral gap between a first side surface of the device that is different than the bottom surface and a first one of the plurality of sides solder resist layer, wherein there is a second lateral gap between a second side surface of the device that is different than the bottom surface and a second one of the plurality of sides of the solder resist layer;
one or more interconnects configured to provide one or more electrical paths between the substrate and the device, the one or more interconnects positioned within the interior opening; and
an encapsulation layer located over the solder resist layer and located within the first lateral gap and the second lateral gap and between the device and the substrate within the interior opening.

28. The apparatus of claim 27, wherein the solder resist layer is configured as a seating plane for the device.

* * * * *